US 6,580,075 B2

(12) United States Patent
Kametani et al.

(10) Patent No.: US 6,580,075 B2
(45) Date of Patent: Jun. 17, 2003

(54) CHARGED PARTICLE BEAM SCANNING TYPE AUTOMATIC INSPECTING APPARATUS

(75) Inventors: Masatsugu Kametani, Tsuchiura (JP); Kenjiro Yamamoto, Matsudo (JP); Taku Ninomiya, Hitachinaka (JP); Osamu Yamada, Hitachinaka (JP); Katsuhisa Ike, Ibaraki-ken (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/251,749

(22) Filed: Sep. 23, 2002

(65) Prior Publication Data

US 2003/0062479 A1 Apr. 3, 2003

Related U.S. Application Data

(63) Continuation of application No. 09/398,044, filed on Sep. 17, 1999.

(30) Foreign Application Priority Data

Sep. 18, 1998 (JP) .............................. 10-264295

(51) Int. Cl.⁷ ............................ G01N 23/00; G21K 7/00
(52) U.S. Cl. .................... 250/310; 250/306; 250/311; 250/396 ML; 250/396 R; 250/397; 250/398; 250/492.2
(58) Field of Search .................................. 250/306, 310, 250/311, 396 HL, 397, 396 R, 398, 492.2

(56) References Cited

U.S. PATENT DOCUMENTS

| 5,578,821 A | 11/1996 | Meisberger et al. |
| 5,986,263 A | 11/1999 | Hiroi et al. |
| 6,465,781 B1 * | 10/2002 | Nishimura et al. ......... 250/306 |

FOREIGN PATENT DOCUMENTS

JP  5-258703  10/1993

* cited by examiner

Primary Examiner—John R. Lee
Assistant Examiner—Zia R. Hashmi
(74) Attorney, Agent, or Firm—Antonelli, Terry, Stout & Kraus, LLP

(57) ABSTRACT

A charged particle beam scanning inspecting apparatus for irradiating a charged particle beam, fetching information of a subject to be inspected at a predetermined beam scanning position and performing an inspection by processing the information. The apparatus is a measurer which measures a scanning position of the beam and an inspection position on said inspection subject to calculate beam target coordinates corrected for an apparatus error, an error correction constant and a deflected distortion correction constant, and a deflection controller for scanning the beam. The deflection controller includes a deflection position operating circuit for performing an operation of the inspection position in a deflection coordinate system, a deflected distortion operating circuit. The deflection position operating circuit and deflected distortion operating circuit are constructed in a pipe line fashion.

4 Claims, 15 Drawing Sheets

130

131

132

133

CORRECTION

CHARGED PARTICLE BEAM SCANNING TYPE AUTOMATIC INSPECTING APPARATUS

CROSS REFERENCE TO RELATED APPLICATION

This is a continuation of U.S. application Ser. No. 09/398,044, filed Sep. 17, 1999, the subject matter of which is incorporated by reference herein.

BACKGROUND OF THE INVENTION

The present invention relates to a beam scanning type inspecting apparatus for performing inspection by scanning a beam.

JP-A-5-258703 (U.S. patent application Ser. No. 710,351 filed on May 30, 1991. Continuation application matured to U.S. Pat. No. 5,502,306) describes an apparatus for automatic inspection of X-ray masks and other conductive substrates. In the inspecting system, an electron beam image obtained by scanning a mask with an electron beam is compared with a reference to detect a defect. The inspecting system has detection modes which are a die/die mode for comparison between two dice and a die/database mode for comparison of a die with a database of a CAD.

For the sake of scanning the electron beam, the inspecting system has a deflector controller and an analog deflection circuit.

The deflector controller calculates a desired movement of a stage and sends a signal corresponding to the amount of movement to a stage servo. The deflector controller also calculates a desired deflection of the beam and sends its data to the analog deflection circuit.

The data sent from the deflector controller to the analog deflection circuit indicates a slope value which is an inclination amount of a ramp wave and this digital signal is converted into an analog voltage by means of the analog deflection circuit. A ramp generator generates the ramp wave on the basis of the analog voltage. In the inspecting system, controllable state quantities are the slope value indicative of the inclination amount of the ramp wave and a retrace value indicative of the amount of swing return of the ramp wave. The inclination amount of the analog signal designated by the slope value is compared with a line size value which is an adjusting value and an offset value designated by the retrace value is compared with an biased value which is an adjusting value. Comparison results are fed back in an analog fashion. An information fetching position is prescribed by using an external inspection start/end signal.

The scheme in which the deflection circuit is constructed of an analog integrating circuit as in this inspecting system will hereinafter be called an analog scheme.

On the other hand, with the miniaturization technology advanced, an integrated circuit manufactured by utilizing the inspecting system as above is designed at present such that for example, a 256 mega DRAM has a line width of about 0.25 µm. Concomitantly with the miniaturization, inspection of particles and pattern defect has been considered to be more important in present-day inspecting apparatus than in the conventional inspecting apparatus.

But the analog deflection scheme employed in the conventional inspecting system faces problems as below.

In the analog deflection scheme, a high-precision analog integrating circuit is used to conduct a constant operation which is required of high linearity. But because of leakage current in operational amplifiers, capacitors and resistors, the linearity is distorted and the distortion is difficult to correct.

Further, only a portion of less linearity error is used by using the external inspection start/end signal, thus raising a problem that a positional difference is caused by a difference in time accuracy between a start/end signal generator circuit and an analog signal generator circuit.

Further, the accuracy is sometimes compensated by an analog feedback loop and in that case, an error is caused during a time interval which starts immediately after the setting is changed and ends when stabilization is reached, making it impossible to deal with high-speed setting change.

Further, in general, there exists biased distortion due to non-uniform electric fields and magnetic fields in the deflector and the column of the inspecting apparatus but the biased distortion is difficult to correct in the analog scheme.

Especially, when pattern comparison for separate sites as represented by chip comparison inspection is carried out, differences in large positional offset attributable to cumulation of errors and in error and distortion of arrangement (rotation and size) caused when drawing is performed on two patterns to be compared cannot be corrected, with the result that the positional accuracy matters and disadvantageously, the comparison inspection cannot proceed satisfactorily.

Further, because of difficulties in the distortion correction, a site subject to non-uniform biased distortion as represented by the wafer outer periphery cannot be inspected.

In addition, when conducting the pattern comparison inspection for the separate sites without changing and correcting the setting, elimination of distortion and maintenance of high accuracy are required for the whole of the apparatus, especially, for the optical system, the deflection unit and deflector and the stage inclusive of its control system. As a result, the cost is raised as a whole and the fabrication term is elongated in connection with tuning owing to difficulties in keeping accuracies caused by the distortion and errors.

Further, when the wafer size is increased, for example, when the wafer diameter is increased to 12 inches to increase the inspection area, the demand for high speed and high accuracy is accelerated.

On the other hand, in realizing a high-speed high-precision digital operation processor, problems as below are encountered.

To conduct a high-precision high-speed operation, real number operation processes must be executed in a parallel pipe line fashion and a great number of transistors are needed. In addition, since the real number operation process is interlinked to a controller operative on real time, it is necessary to keep the latency small in the process and besides, from the standpoint of reduction of wiring, the construction must be compact. Therefore, a very highly integrated LSI or electronic board must be materialized and high-quality logic design technology and transistor number reduction technology are required.

To meet the above requirements, many transistors in a small area are frequently subjected to switching operation and concomitantly, a large amount of heat will be generated. Circuit design for suppressing heat generation must be contrived.

However, this leads to a large-scale and complicated circuit construction which is costly.

Also, smooth interchange of information must be effected in synchronism with a high-speed clock between a master processor and the high-speed digital operation processor. A conventional means using a 2-port memory faces problems of limited access speed and access conflict of memory devices and the high-speed operation is difficult to achieve.

Further, to apply a command value to a subject to be controlled, high-precision high-speed control output operation data must be converted into a predetermined analog signal.

In the digital/analog conversion, however, restriction is imposed on the high-speed high-precision digital/analog converter. More particularly, it is difficult to deliver a result of the operation process, with its error component corrected, in the form of high-precision digital data at a clock period of, for example, 10 ns or less with an accuracy of 12 bits or more, and the operation speed cannot be increased to above that level.

On the other hand, in an electron beam drawing apparatus, a deflection control system of digital scheme is adopted as described in, for example, JP-A-5-226234. The deflection in the electron beam drawing apparatus is of the multi-stage deflection type and the deflection type per se differs from that in the inspecting apparatus. Also, the demand for high-speed operation is less stringent in the drawing apparatus than in the inspecting apparatus but in the digital scheme of the inspecting apparatus, a correction signal must be delivered at a time point within the image fetching period. In this manner, technical idea of control is greatly different for the two kinds of apparatus and it is difficult to adopt the digital scheme of the electron beam drawing apparatus as it is in the inspecting apparatus.

SUMMARY OF THE INVENTION

An object of the present invention is to provide a high-speed high-precision beam scanning type inspecting apparatus which can make various kinds of correction with ease.

To accomplish the above object, according to an aspect of the present invention, a charged particle beam scanning type inspecting apparatus has a deflection controller for controlling the scanning position of a charged particle beam to irradiate the charged particle beam onto a predetermined beam scanning position of a subject to be inspected, fetch information from the inspection subject and inspect the inspection subject by processing the information, wherein the deflection controller delivers a digital signal for control of the scanning position of the charged particle beam at a time point within an image fetching period and converts the digital signal into an analog voltage at a time point within the image fetching period to thereby control the scanning position of the charged particle beam.

According to another aspect of the invention, a charged particle beam scanning type inspecting apparatus for irradiating a charged particle beam, fetching information of a subject to be inspected at a predetermined beam scanning position and performing an inspection by processing the information, comprises:

a correction constant calculating unit for measuring a scanning position of the beam and an inspection position on the inspection subject to calculate beam target coordinates corrected for an apparatus error, an error correction constant and a biased distortion correction constant; and a deflection controller for performing the beam scanning, the deflection controller including:

a deflection position operating circuit for performing an operation of the inspection position in a deflection coordinate system necessary for accurate scan of the inspection position on the inspection subject by using the beam target coordinates externally set in advance or as necessary, the error correction constant, a scan constant and present coordinates of an inspection stage; and a biased distortion operating circuit for correcting biased distortion by using the biased distortion constant externally set in advance or as necessary and the deflection position and performing an operation of the deflection control amount necessary for accurate irradiation of the beam onto the deflection position.

With the above construction, the deflection scanning position can be corrected at a time point within the period for fetching the information from the inspection subject.

According to the invention, there is provided means for sequentially changing the biased distortion correction constant supplied to the deflection controller during inspection, and near the wafer outer periphery, that is, a portion where the biased distortion is non-uniform, a biased distortion correction constant corresponding to a wafer position measured in advance is used as the biased distortion correction constant.

With this construction, distortion at the portion where the distortion is non-uniform can be corrected.

According to the invention, the position, rotation and size of first and second patterns and optical system distortion are measured in advance to calculate a scan constant and a correction constant and during continuous inspection, scan parameters and the correction constant are changed sequentially.

Through this, even when the arrangement error and distortion differ for the patterns to be compared, accurate comparable pattern information can be obtained by correction through scanning.

According to the invention, the period is 10 ns or less.

Through this, the deflection output which exceeds 200 MHz image information fetching frequency required from the relation between the inspection time and the beam irradiation time for control of electric charge on the inspection subject can be obtained.

According to the invention, the digital value of the deflection control amount has a significant digit of 16 bits or more.

Through this, a required deflection area of 500 $\mu m^2$ or more and a required accuracy of 20 nm or less can be realized.

According to still another aspect of the invention, a beam scanning type inspecting apparatus has a beam light source, an optical system controller for controlling the beam state, a deflector for deflecting a beam from the beam light source, an inspection stage and inspection stage controller for detecting and controlling the position of a subject to be inspected, a deflection controller for generating a digital deflection control value corresponding to a target beam deflection position through a digital operation in accordance with position or speed information from the inspection stage and a constant set externally as necessary or in advance, an image detector for obtaining digital image information at a beam scanning position on the inspection subject in timed relationship with a timing of the beam scanning, and an image processor for processing the digital image information to inspect the inspection subject, the deflection controller comprising an inspection stage position data input unit for receiving position or speed information from the inspection stage operative at a period different from that of the deflection controller, a scanning sequence/timing control unit for managing execution of scanning sequence and timing such as a timing for fetching the image in accordance with a scan constant defining scanning of one beam, deflection position correction means for performing an operation of the inspection position in a deflection coordinate system necessary for accurate scan of the inspection position on the inspection subject, biased distortion correction means for correcting biased distortion by using the constant set externally in advance or as necessary and the deflection position and performing an operation of the deflection control amount necessary for accurate irradiation of the beam onto the deflection position, DAC input data generating means for processing the digital data indicative of the deflection control amount to cause it to correspond to a predetermined analog value and generating data supplied to one or a plurality of digital/analog converters (DAC's) a digital/analog converting unit for converting the data into an analog value, a parameter and system managing means for performing interchange of external data, system management of the deflection controller and parameter management for setting;:and changing parameters, and a register unit for interchanging constants between said deflection position correction unit and/or said biased distortion correction unit being operative at a high speed at first period and said parametr/system managing unit at a lower speed than that at said first period.

With this construction, a high-speed high-precision digital operation processor can be realized which serves as the deflection control circuit of the beam scanning type inspection apparatus and which can deliver a correction signal at a time point within the image fetching period.

According to the present invention, the deflection controller includes sensor input means or means for inputting information concerning height distribution depending on the wafer position and focus correction operating means, the constant concerning the biased distortion set in the biased distortion correction means by means of the parameter managing unit is changed as the height changes, and a change in focus depending on the height change is operated by means of the focus correction operating means to correct the focus.

Through this, in any area on the wafer, a change in beam position and a change in beam size or diameter due to a change in height can be corrected, thereby ensuring that the fetched image information can always be uniform and the accuracy of image comparison when patterns of separate sites are compared can be improved.

According to the present invention, the deflection controller includes astigmatism correction operating means and focus correction operating means to correct astigmatism and focus in accordance with the deflection position calculated through the deflection position correction operation.

Through this, even in any enlarged wide deflection area, the beam diameter and beam shape can be maintained correctly, the fetched image information can always be uniform and the image comparison accuracy can be improved when patterns of separate sites are compared.

According to the present invention, the biased distortion control means includes a digital operation processor for performing a digital operation process in synchronism with a high-speed clock period, an operation of a basic unit of the operation process is carried out by a MAC operating unit having a real number multiplier and a real number adder operative in a pipe line fashion and united by combining means, an d the combining means brings a final stage pipe line register serving as an output stage of the real number multiplier and an initial stage pipe line register serving as an input stage of the real number adder into the same level, and a process of the final stage of the real number multiplier and part of the initial stage of the real number adder are operated in parallel.

With this construction, since the output stage of the real number multiplier and the input stage of the real number adder are at the same level, these signals can be processed in parallel, so that the final stage of the real number multiplier need not be followed by a stage for conversion into the IEEE format and data kept in the internal format can be transferred to the succeeding stage of the real number adder.

Accordingly, there is no need of a stage for execution of conversion of the results from the multiplier into the IEEE format at the initial stage of the real number adder. Further, by virtue of the construction using the real number operating units, a significant digit of 24 bits can always be maintained.

According to the present invention, the preceding register unit includes a digital operation processor being operative to perform a digital process in synchronism with one high-rate clock and having the inspection stage data position input unit, the scanning sequence/timing managing unit, the deflection position correction means, the biased distortion correction means, the DAC input data generating means and the DA converter, one or a plurality of processors constituting the parameter managing and system managing means and operative in synchronism with a second clock asynchronous with the high-speed clock are provided, a latch register unit of two-stage structure is provided as means for supplying data from the processors to the digital operation processor at a desired time point, a latch register of the first stage has the function of latching the data from the processors in response to a first gate signal, a latch register of the second stage has the function of latching data from the latch register of the first stage in response to a second gate signal and supplying the latched data to the digital operation processor, the first gate signal is generated on the basis of a write access signal from the processors, and the second gate signal is generated on the basis of a signal obtained by making a trigger signal, delivered out of the processors and prescribing a timing for supplying data to the digital operation processor, synchronous with the high-rate clock.

By providing the processor for processing the information changing at a low speed at a second period in the operation processor for processing the information changing at a high speed at a first period, division into a portion controlled at a low speed and a portion controlled at a high speed is effected to permit suitable control and smooth interchange of information between the portions operable at the two kinds of periods can be realized. Through this, the operation means operable to process the high-speed digital operation process can be used without being affected by the information interchange period and the digital operation process being necessary for the deflection controller of digital type of the inspecting apparatus and being capable of performing the high-speed high-precision data process can be realized.

According to the invention, the DAC input data generating means is a digital operation processor for converting digital data into analog data and delivering the analog data in synchronism with the high-rate clock period and includes means for dividing the digital data into at least two output data pieces each constructed of a continuous bit train, memory means for storing correction data corresponding to upper digit output data, at least three digital/analog converters for delivering the at least two output data pieces and analog data corresponding to correction data, means for converting the at least two output data pieces into a data format supplied to corresponding digital/analog converters, and means for matching output timings of the at least two output data pieces and the correction data, whereby analog data pieces of the at least three digital/analog converters are added in an analog fashion to generate a high-precision analog output.

With this construction, the digital operation processor being necessary for the deflection controller of the digital type deflection controller and being capable of suitably converting the digital signal subject to the high-speed operation process into the analog signal at a high speed with high precision.

Still further advantages of the present invention will become apparent to those of ordinary skill in the art upon reading and understanding the following description of the preferred embodiments.

BRIEF DESCRIPTION OF THE DRAWINGS

The invention will be described in conjunction with certain drawings which are for the purpose of illustration of the preferred and alternate embodiments of the invention only, and not for the purposes of limiting the same, and wherein.

DESCRIPTION OF THE EMBODIMENTS

Figure 1:
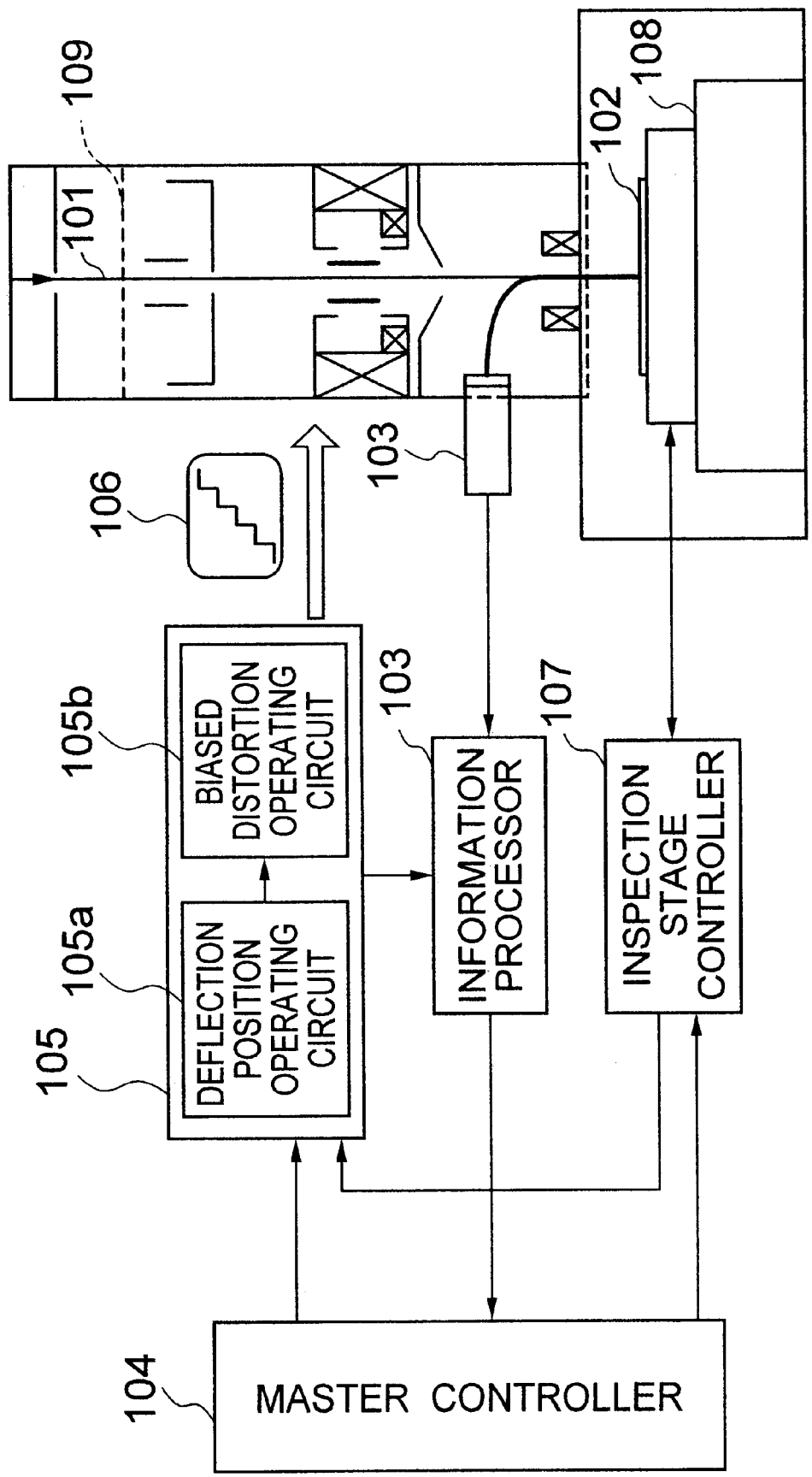
FIG. 1 is a block diagram for explaining, in a simplified manner, the concept of deflection control in a charged particle beam scanning type inspecting apparatus of the present invention.

Construction in an Embodiment of an Inspecting Apparatus According to the Invention Referring to FIG. 1, the concept of deflection control in a charged particle beam scanning type inspecting apparatus of the invention is diagrammatically illustrated. Especially, drastic effects of the present invention are found in this type of inspecting apparatus and the invention will therefore be described by way of the aforementioned inspecting apparatus. But it will be appreciated that the invention can also be applicable to any types of apparatus which deflect a beam from a beam light source to scan the beam, for example, a drawing apparatus, a microscope (SEM) and the like.

The charged particle beam scanning type inspecting apparatus shown in FIG. 1 is an apparatus for conducting an inspection of the presence or absence of defects in a subject to be inspected and an analysis of the defects. In the apparatus shown in FIG. 1, a charged particle beam 101 is irradiated onto a subject to be inspected 102. Secondary electrons and reflected electrons generated from the inspection subject 102 under the irradiation of the charged particle beam 101 are fetched by a detector of an information processor 103 to provide information about the inspection subject and the inspecting process is carried out by subjecting the information to pattern comparison.

A master controller 104 carries out an operation such as statistical processing of errors in the inspection position and scanning position on the basis of a designated beam scanning position and image information of the inspection subject obtained from the information processor 103. By using the results of the operation, the master controller 104 calculates an apparatus error and an image distortion so as to calculate beam target coordinates applied with correction, an error correction constant and a biased distortion correction constant. Further, these constants are transmitted to a deflection controller 105 in advance or as necessary in order for the deflection controller to conduct a correction operation.

The deflection controller 105 adapted to control a deflector 109 for beam scanning proceeds with correction of deflection scanning signals through a totally digital operation for the purpose of realizing the distortion correcting function of the present invention. The control scheme of the deflection controller 105 is a digital deflection control scheme in which digital values are sequentially converted into analog values by a time-series of digital control signal to form a deflection scanning waveform 106.

A digital operation operable at the highest frequency in the deflection controller 105, which digital operation constitutes the correction operation in the digital deflection control scheme, can be executed on real time by means of main components of the deflection controller 105, that is, a deflection position operating circuit 105a and a biased distortion operating circuit 105b.

Firstly, the deflection position operating circuit 105a receives, from the master controller 104, beam target coordinates set in advance or as necessary and applied with correction for, for example, apparatus error, a constant for correction of an error such as drift and a scan constant prescribing a beam scanning method and, from an inspection stage controller 107, present coordinates of an inspection stage 108, so as to conduct an inspecting position operation in a deflection coordinate system established to assure accurate scan of an inspecting position on the inspection subject.

The biased distortion operating circuit 105b receives a biased distortion constant set in advance or as necessary from the master controller 104 and a deflection position represented by a result of the operation by the deflection position operating circuit 105a and uses them to correct biased distortion, thereby carrying out a deflection control amount operation necessary for accurate irradiation of the beam onto the deflection position.

By constructing the two operating circuits in the form of a pipe line using an integrated circuit, the deflection scanning position can be corrected within a time which is shorter than a period for fetching information about the inspection subject. The pipe line technique will be detailed hereinafter.

Outline of Construction of a Wafer Inspecting Apparatus

Figure 10:
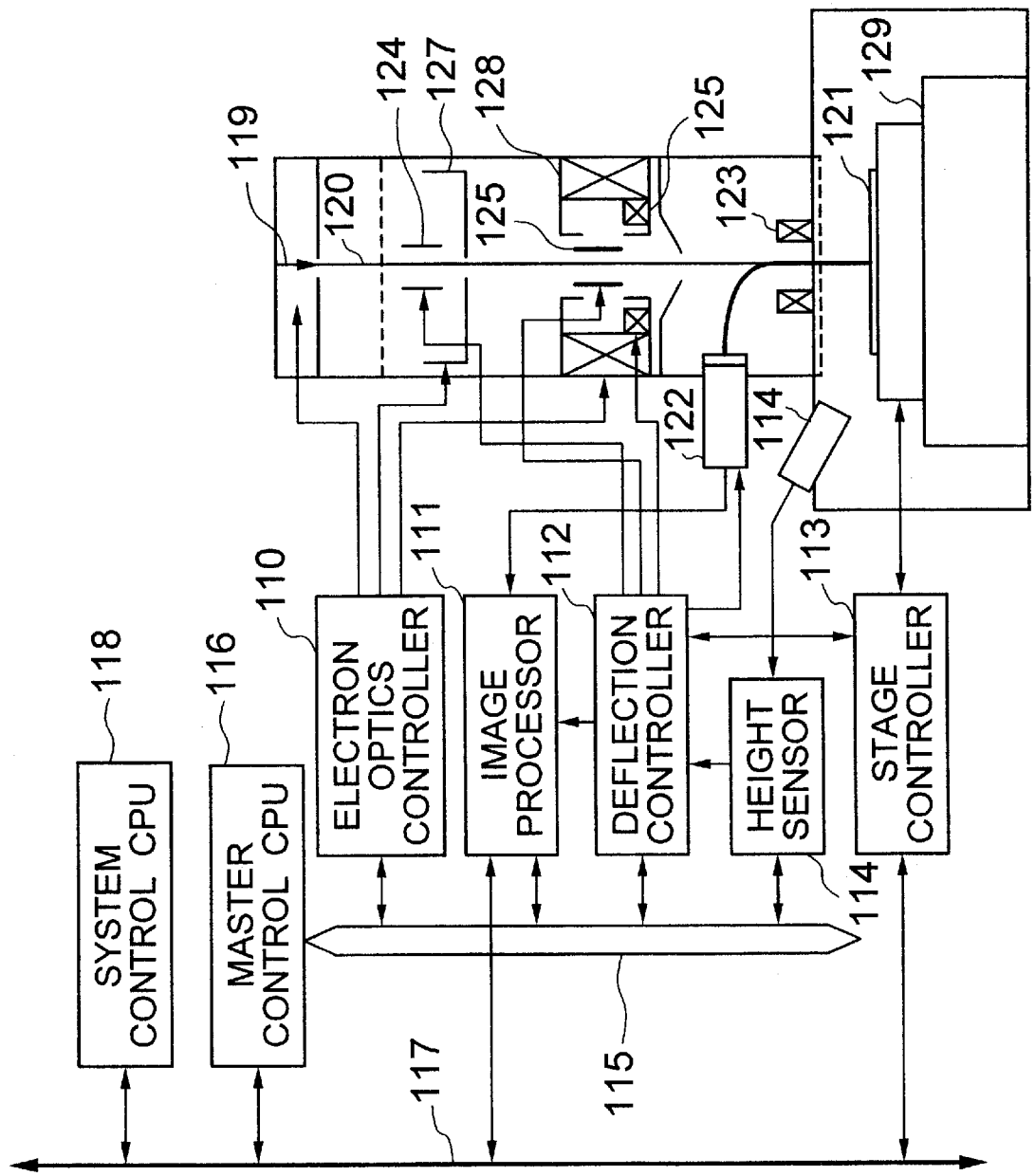
FIG. 10 is a schematic diagram showing the whole of an electron beam scanning type wafer external appearance inspecting apparatus.

Referring to FIG. 10, the overall construction of an electron beam scanning type wafer external appearance inspecting apparatus as a concrete embodiment of the charged particle beam scanning type inspecting apparatus will be outlined. The controller shown in FIG. 10 is mainly classified into an electron optics controller 110, an image processor 111, a deflection controller 112 and a stage controller 113. The former three controllers and a height sensor 114 for measuring the height at the surface of a wafer are coupled to a master control CPU 116 through a VME (versa module Europe) bus 115 so as to be controlled collectively. Further, the stage controller 113 and the master control CPU 116 are coupled, through a LAN 117, to a system control CPU 118 which controls operation of the whole system. The information processor 103 in FIG. 1 corresponds to the image processor 111 in FIG. 10, the master controller 104 in FIG. 1 corresponds to the master control CPU 116 and system control CPU 118 in FIG. 10, the deflection controller 105 in FIG. 1 corresponds to the deflection controller 112 in FIG. 10 and an inspection stage controller 107 in FIG. 1 corresponds to the stage controller 113 in FIG. 10.

The electron optics controller 110 controls various power supplies and currents as well as the state of an electron beam. An electron beam 120 emitted from an electron gun 119 is accelerated and irradiated on a wafer 121 by utilizing the lens function attributable to a focusing coil 126. The controller 110 controls, for example, not only the optical axis adjustment and focus/astigmatism adjustment for the electron beam 120 but also the irradiation intensity. Enlargement/reduction of the beam size or diameter having relation to the size and resolution of defects to be inspected is accomplished by means of a focus aperture and the irradiation intensity is controlled by beam current, accelerating voltage and retarding voltage. The beam current is measured as a value of a current flowing into a Faraday cup 127 when voltage is applied to a blanking electrode to be described later.

A detector 122 fetches secondary electrons generated from the wafer 121 and deflected by a Wien Filter deflector 123 and converts the amount of secondary electrons into variable-density digital information which in turn is sent to the image processor 111.

The image processor 111 detects the kind of a defect formed on the wafer 121 and its position through a comparison inspection in which the variable-density digital information is compared with information of the same pattern formed on the wafer 121. The system control CPU 118 directly receives data of the defect formed on the wafer to display the results of the inspection and perform control complying with an operation by the operator.

In order to make the timing for deflecting the beam coincident with the timing for fetching an image, the deflection controller 112 transmits a timing signal to the image processor 111 and the detector 122.

On the basis of stage position information obtained from a laser interferometer, the stage controller 113 controls the position and moving speed of a stage 129 or a specimen 121 such as the wafer which is an inspection subject. The position information of the laser inforferometers obtained from the stage controller 113 is also transmitted concurrently to the deflection controller 112 adapted to carry out position tracking correction.

The deflection controller 112 on/off controls a blanking electrode 124 in order to prevent the electron beam 120 from being irradiated on the wafer when the inspection is not conducted. The controller 112 also controls a deflector 125 for astigmatism correction control and beam deflection control and the dynamic focusing coil 126 for focus correction. The deflector 125 is constructed of an electrostatic deflector having 8 or more pole plates and operates to deflect the electron beam 120 under voltage control so as to control the beam irradiation position on the wafer 121. In addition to the function of scanning the beam in accordance with an inspection sequence, the deflection controller 112 has the function of performing an operation to correct biased distortion and drift and an operation to track the stage position and reflects the results of the operations upon control values supplied to the deflector 125.

Description of Inspecting Method (Inclusive of Chip Comparison)

Figure 11A:
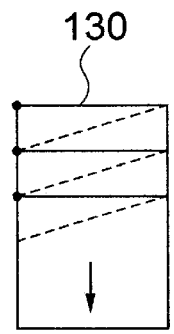
FIGS. 11A, 11B, 11C, 11D and 11E are diagrams for explaining examples of scanning sequence in the inspecting apparatus.
Figure 11B:
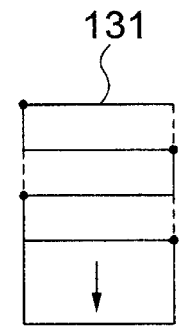
Figure 11C:
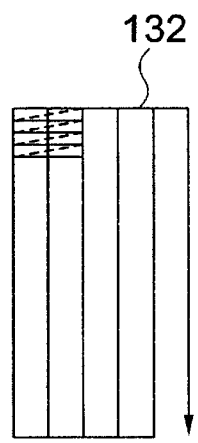
Figure 11D:
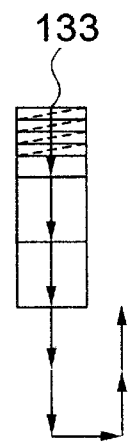
Figure 11E:
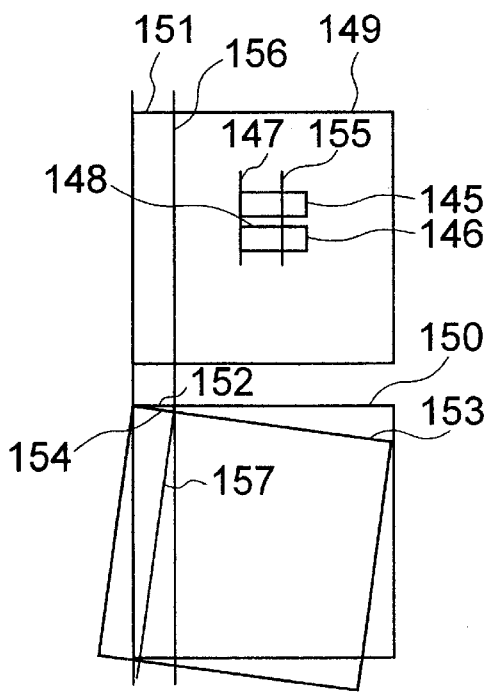

Referring to FIGS. 11A to 11E, an example of the scanning sequence in the inspecting apparatus shown in FIG. 10 will be described. The scanning sequence must be determined depending on requests made by the user, electrical characteristics of an inspection subject and required accuracies and a method shown in the figure does not cover the completion of scanning sequence. FIGS. 11A and 11B show scan methods, FIGS. 11C and 11D show stage moving methods and FIG. 11E shows an example of a comparison method to be described later.

In a scan method 130, scanning is effected in one direction and blanking is carried out as indicated by dotted line so as not to irradiate the beam on the wafer. In a scan method 131, scanning is effected bidirectionally or in reciprocatory directions and blanking is not needed. The scan method 131 is therefore suitable for high-speed operation but has asymmetry between forward and return paths, thus being inferior to the scan method 130 in position accuracy.

FIG. 11C depicts a locus 132 of scanning on the wafer in the case of a stage continuous moving mode and FIG. 11D depicts a locus 133 of scanning in the case of a step and repeat mode. In the step and repeat mode, an image in a deflection area is acquired during one stage stop state and the stage is moved stepwise to the next inspection position where an image in the next deflection area is acquired. By repeating the above operation, images in a plurality of deflection areas can be linked to each other to provide an image of the wafer.

In the stage continuous moving mode, the moving distance of the beam on the wafer during one scanning matches with the stage moving distance within one scanning time, so that a continuous image can be obtained without causing the stage to stop and deviate from the deflection area. As shown in FIGS. 11C and 11D, the beam is scanned in the reciprocatory directions of the stage to permit inspection of the whole surface of the wafer. In the stage continuous moving mode which does not require the time for operating the stage stepwise, inspection can be executed continuously a higher speed but deflection control or stage control is needed to prevent the target position from deviating from the deflection area. The stage can be moved and the beam can be scanned in any directions in which the comparison inspection can be assured but when considering that the chip pattern is rectangular, it is preferable that scanning be effected in a direction coincident with the chip pattern direction. Essentially, in this case, the stage moving direction is substantially orthogonal to the beam scanning direction. From the standpoint of the accuracy of stage movement, higher accuracy can be obtained with a single axis non-interlocked operation than with a 2-axis interlocked operation. Therefore, the chip direction or wafer direction may sometimes be made coincident with the stage axis.

Since the deflection controller of the present invention can designate the scan method by settling digital values of the scan start position and the moving distance at the output period every a scanning, it can deal with any types of scan methods.

Figure 12:
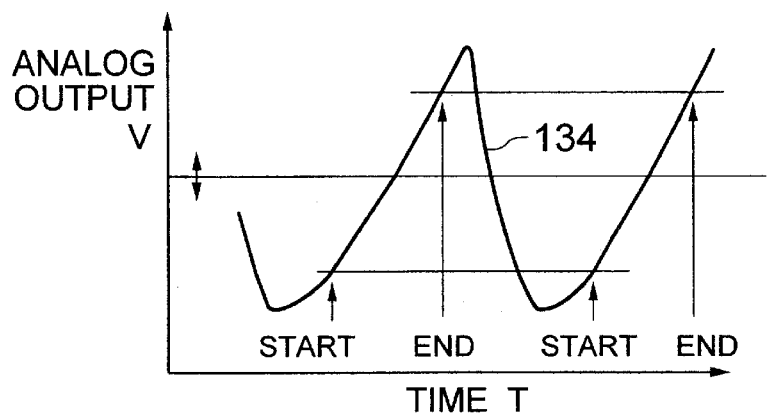
FIGS. 12A, 12B and 12C are diagrams for explaining the relation between an deflection output signal during beam scanning and typical timing signals.
Figure 12:
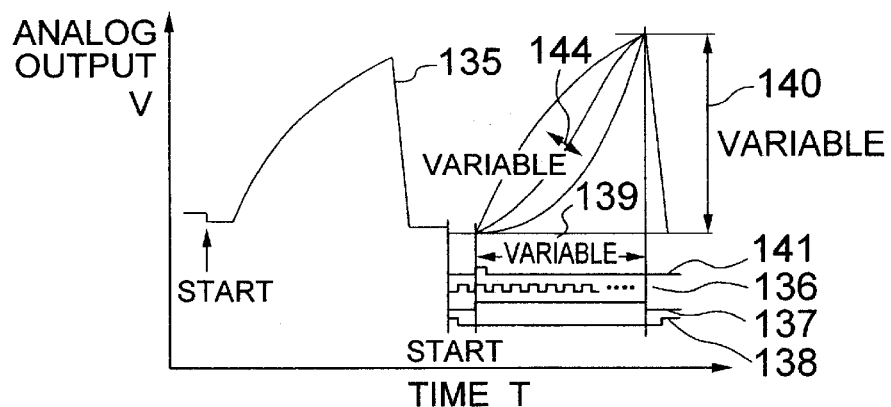
Figure 12:
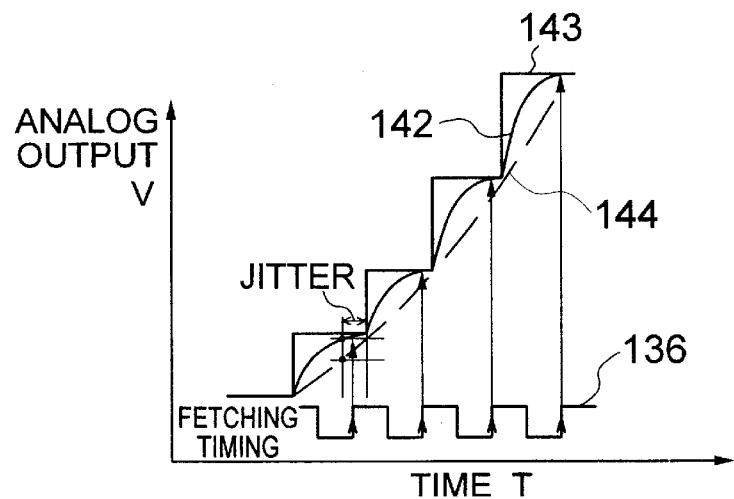

FIG. 12A graphically explains a ramp wave in the conventional analog scheme. As shown in the figure, a ramp wave 134 is not exactly linear and actually, to use an area in which a straight line can be approximated, a start signal and an end signal are prescribed.

FIG. 12B graphically explains the relation between a deflection output signal for beam scanning during one scanning operation and a typical timing signal in the digital type deflection controller. The deflection output signal of only one axis is shown in the figure but analog deflection output signals for the X-axis direction and the Y-axis direction substantially orthogonal thereto are delivered. As shown in the illustrated example, the analog output for the X-axis or Y-axis direction substantially takes the form of a ramp wave 135. The start input, a scan start signal 141, an image fetching timing signal 136 which is a synchronizing signal, an image fetching effective signal 137 and a blanking signal 138 are related to each other as illustrated in the figure.

In the illustrated example, the image processor 111 fetches wafer information as a pixel in synchronism with the rise of the image fetching timing signal 136 when the image fetching effective signal 137 is active, thus providing a wafer pattern image.

The deflection controller of the invention sets digital values representative of various timings as above. Actual timings are set by reflecting delicate timings such as delay times in the individual circuits and the difference in signal propagation time and therefore differ in positional relation from the illustrated relation. In addition to the above factors, constants for defining scan in the present embodiment include intervals at which each pixel is fetched, the number of pixels during one scanning operation and the pitch by which pixels are aligned on the wafer and in the present embodiment, the interval at which each pixel is fetched has a typical value of 10 ns, the pixel number during one scanning operation has a typical value of 1024 and the pixel pitch on the wafer has a typical value of 0.1 $\mu$m. Through the setting as above, the ramp wave is defined to have a width 139 and a height 140.

FIG. 12C is an enlarged diagram of FIG. 12B and graphically explains the deflection output signal in the digital type deflection controller according to the present invention. In association with a digital deflection output signal 143 delivered at the image fetching period relative to an output target on continuous curve 144 indicative of the scan target position, an analog deflection output signal 142 which has passed through the digital/analog converter (DAC) settles into a target voltage within a predetermined settling time.

One step-like step of the digital deflection output signal 143 assumes a voltage corresponding to a distance of one pixel interval when the image fetching period coincides with the deflection output period. On the assumption that the deflection position allowable error is about 1/10 of pixel, the settling time is prescribed by a time for about 90% of the target voltage or the voltage corresponding to one pixel to be reached.

In case the output period is set to ½ of the image fetching period, the voltage for one step is nearly halved and the settling time is prescribed by the time required to reach about 80% of the target voltage, that is, the voltage corresponding to about ½ of one pixel.

Accordingly, when taking the case of the aforementioned specifications, for instance, the settling time prescribed to about 90% of the target voltage can be within 10 ns when the image fetching period is made to be coincident with the deflection output period and the settling time prescribed to about 80% of the target voltage can be within 5 ns when the output period is set to ½ of the image fetching period. For example, in the case of the above target accuracy, analog circuits following the DAC may have specifications which satisfy the present specifications.

Time Dependent Changes

In the case of the analog scheme, the timing signal is generated by a separate circuit and synchronization is set up by using analog devices such as comparators and switching devices, with the result that time dependent changes or the jitters amount up to a large value which is approximately several of ns and cause a positional offset.

In the case of the digital scheme, since timings of various kinds of output signals such as image fetching signal 136 and digital deflection output signal 143 are prescribed by the same clock, the aforementioned jitters do not occur. Even in the event that the jitters take place during propagation, their influence upon the positional offset is small and positional accuracy can be improved. Further, the synchronization signal can be set after the settling time is determined, thus facilitating adjustment.

FIG. 11E diagrammatically explain an example of pattern defect inspection. The pattern defect inspection is carried out through comparison of pattern images. Technically, for one thing, design data is compared with a pattern on the wafer and for another thing, image information pieces at positions on the wafer where the same pattern is drawn are compared with each other. The comparison can be made either in a unit of cell or in a unit of chip. The former is commensurate to a device in which small cells such as memories are arranged regularly and the latter is commensurate to a CPU and an ASIC in which non-repetitive complicated patterns are formed over the whole of the chip.

When a cell 145 is compared with a cell 146 in the example of FIG. 11E, the stage controller and the deflection controller operate in interlocked relationship to start scanning of a stripe 155. After acquiring an image of a line 148, the image processor compares the acquired line image with an image of line 147 which has already been acquired. Defect decision is made on the basis of the difference in line image throughout the whole cell area. Accordingly, in deflection scanning for the cell comparison, positional accuracies of at least the lines 147 and 148 must be maintained. Similarly, in the case of chip comparison inspection, a stripe 156 is scanned for comparison inspection of chips 149 and 150 and a line 151 is compared with a line 152. Here, an inspection area on the wafer extending in the stage moving direction is called a stripe and an inspection area on the wafer extending in the direction of one scan is called a line. The cell on the one hand has a width of 10 $\mu$m at the most but the chip on the other hand has a maximum width of about $3 \times 10^4$ μm at present, indicating that the chip comparison needs an accuracy which is about 3000 times the accuracy in the cell comparison at the worst.

Further, in the case of the chip comparison, a positional error and a chip position rotation error occur depending on a technique of drawing patterns on the wafer and in this case, the chip 150 will actually be located as indicated by a chip 153 and the line 152 will be replaced with a line 154, raising a problem that the chip comparison inspection cannot be practiced with only simple straight scanning on the stripe 156 and correction must be made depending on the chip position as indicated by a stripe 157.

More specifically, in a chip drawn with, for example, a stepper, the positional error is about 0.05 μm at its maximum and the rotation error is about 0.05 μm at its maximum. These errors correspond to about 0.5 pixel in terms of the inspection condition and cannot be neglected. Accordingly, in order to carry out the chip comparison inspection with the aforementioned accuracy, the beam position is required to be corrected in relation to the chip position. As for the chip position data in the present embodiment, the system control CPU 118 of FIG. 10 calculates positions of chip and cell in advance on the basis of design data and measured data to provide data for beam scanning and data for comparison inspection which in turn are transferred to the deflection controller 112 and the image processor 111, respectively.

Explanation of Error and Distortion (Inclusive of Wafer Outer Periphery)

By taking the electron beam scanning type wafer inspecting apparatus, for instance, four events of error and distortion in the target inspection position which are responsible for a problem of degradation of inspection position accuracy in the deflection scanning will be picked up and methods of solving the disadvantageous events according to the invention will be described hereunder.

Errors in Target Inspection Position (Coordinate Correction Related to Alignment) In the present invention, errors in target inspection position can be corrected through a method to be described below.

An error in target inspection position is mainly due to an error caused by a fabrication apparatus during chip fabrication and an error caused by an inspecting apparatus during inspection following mount of a wafer.

The fabrication apparatus attributable error includes an error in die position which is quite different for individual drawing apparatus. For example, in the case of the stepper apparatus, there are a positional error in a unit of collective exposure area which is due to lens accuracy and lens mount accuracy and an error in die arrangement due to wafer mount position offset and accuracy of position of a stage in the drawing apparatus. In contrast thereto, relatively high accuracies can be obtained with an electron beam direct drawing apparatus.

The errors in drawing as above cause a die actually drawn on the wafer to have, in relation to a position of the die to be drawn in design, errors affecting offset, rotation, orthogonality, enlargement/reduction (reduction ratio) and distortion in a unit of collective exposure area which is called trapezoid or distortion.

The inspecting apparatus attributable error includes an error in mount such as rotation of the deflector and offset of the optical axis center, an error in mounting of the plane mirror for measurement of the stage position, an error in flatness of the plane mirror and an error in mount position of the wafer.

Essentially, the errors as above can be measured through so-called alignment in which a detecting position of a basic figure such as a mark located at a reference position and a stage;position are measured and compared with each other.

In the case of alignment for calculating the die position error, sequences of alignment for determination of the site at which the mark is detected and the number of marks differ depending on conditions of fabrication of the wafer to be inspected. For example, the mark drawing site differs for wafer fabrication methods and therefore, the same mark detecting method cannot be adopted for all wafers. Differences due to error calculating algorithm are also involved.

For example, in the case of a wafer fabricated with a drawing apparatus of high accuracy, satisfactory correction can sometimes be made by detecting positions of dice at several sites on the wafer, collectively handling chip offsets in terms of chip arrangement to statistically process the arrangement, and calculating an offset of chip arrangement, rotation, a difference in chip pitch and an error in orthogonality. But in the case of a wafer fabricated with a drawing apparatus of poor accuracy, measurement will sometimes be conducted for all chips to assure the positional accuracy. In this case, a single or a plurality of marks described on a chip are detected in order to calculate a packaged position state on a wafer represented by position and rotation of the chip, enlargement/reduction and distortion. But there need at least one mark for having knowledge of the position of the chip, two marks for obtaining rotation and enlargement/reduction values and four or more marks for obtaining distortion value. Accordingly, algorithm for detecting the chip position can be designated by an inspector who knows thoroughly the accuracy of the apparatus and the condition of fabrication of the wafer to be inspected.

Alignment for calculation of inspecting apparatus errors is carried out by using reference marks such as a reference wafer having a known mark position and a wafer holder described with a reference mark at a predetermined position. The aforementioned error in mount of the deflector can be calculated by comparing deflection scanning data with data indicative of an actual beam scanning locus obtained from positional information based on reference marks at several sites within the scanning deflection area. The aforementioned errors in the plane mirror and stage can be calculated by comparing position data of the range finding unit with the beam position obtained through the image process of the results of detection of marks on the wafer.

In this manner, the position error and apparatus error can be calculated from, for example, the position data obtained through the mark detection. In the present embodiment, the system controller (system control CPU) calculates the position, after correction, of a comparison detection subject from the calculated errors and determines the beam scanning position and the scan width and direction.

The digital type deflection controller practiced in the present invention can designate deflection scanning parameters defining a beam locus for one scanning operation such as, for example, the beam scanning start position, scan width and direction and distortion in a unit of line and can comply with any types of beam scanning and besides, by transferring the beam scanning parameters subject to the above error correction from the system controller to the deflection controller, the accuracy of beam scanning position relative to the inspection position required for, for example, chip comparison can be improved. But, the designation is carried out in a unit of line but the correction is made in a unit of pixel at a period of the pixel unit or more. But it is difficult for the conventional analog type deflector to achieve the change of beam scanning such as the continuous change of scan width and direction during scanning, in contrast to the digital scheme.

In the present invention, the provision of means for calculating the beam scanning parameters subject to the error correction is of importance and the method for realization of this concept is not limited to that exemplified herein.

(Drift)

Drift represents one of factors which make it difficult to assure the position accuracy in the chip comparison inspection. The drift corresponds to a change in electron beam deflection position due to a change in output signal concomitant with a change in temperature in analog circuits, charging in the electron beam path and a change in magnetization state. A change of the stage is not included in the drift. The inspection is conducted by comparing image data pieces acquired at intervals of approximately several of milliseconds in the case of cell comparison and at intervals of nearly several seconds in the case of chip comparison and hence, in the chip comparison inspection, stability of position accuracy matters. In the chip comparison inspection, with a view to improve the position accuracy stability and at the same time correct a cumulated drift error, the drift must be corrected as necessary during inspection.

Correction of drift is made by calculating a drift by means of a drift amount calculating means and transferring drift amount data to the deflection control system unit at the time that the system controller designates execution of the correction.

Exemplarily, the drift amount can be calculated by detecting the aforementioned marks during inspection. An operation unit of the deflection control system unit adds data, as it is, obtained from the mark detection to, on the one hand, deflection position data obtained immediately after a deflection stage tracking operation to be described later and on the other hand, to deflection control data subject to biased distortion correction to be described later. The latter addition is used when drift of the beam deflection position takes place for the same control output and that case is involved in the aforementioned factors of drift. The former addition is used when drift of the target position per se takes place and that case is involved in, for example, wafer offset.

Distortion Correction in Optical System Unit

In the present invention, distortion in the optics unit can be corrected through a method to be described below.

Distortion in the optical system unit is caused by non-uniform distribution of the electric field and the magnetic field. Main factors of the distortion are distortion of beam deflection position relative to control voltage due to unevenness of the deflector electric field, distortion in the wafer due to electric field distortion of retarding voltage, distortion due to magnetic fields of various kinds of coils and electric fields of electrodes and distortion due to magnetization and charging at portions in the optics column.

Measurement of the above optical system distortion can be accomplished by using a reference wafer as described above and calculating the difference between a target wafer position and an actual irradiation position during scanning operation within the deflection area. While in the alignment for the position error the marks on the wafer to be inspected are detected and the chip arrangement on the wafer is calculated, the reference wafer in which the mark positions are known is used in the case of the optical system distortion and a coordinate conversion formula 1 (equation 1) indicating the correspondence of the beam position with the control target position in the overall deflection control area at a predetermined site on the wafer is determined.

$$\begin{bmatrix} x \\ y \end{bmatrix} = \begin{bmatrix} a_0 & a_1 & a_2 & a_3 & a_4 & a_5 & a_6 & a_7 & a_8 & a_9 \\ b_0 & b_1 & b_2 & b_3 & b_4 & b_5 & b_6 & b_7 & b_8 & b_9 \end{bmatrix} \begin{bmatrix} 1 \\ x_0 \\ y_0 \\ x_0 y_0 \\ x_0^2 \\ y_0^2 \\ x_0^2 y_0 \\ x_0 y_0^2 \\ x_0^3 \\ y_0^3 \end{bmatrix} \quad (1)$$

Figure 13:
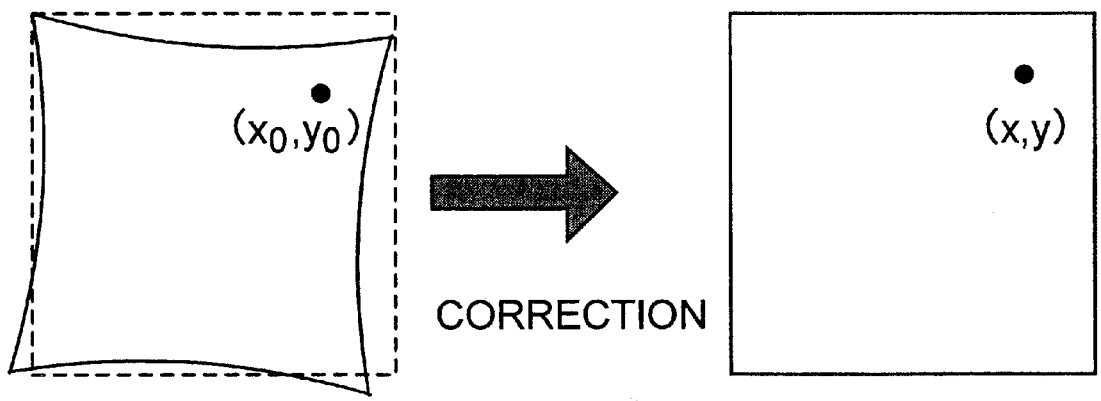
FIG. 13 is a diagram visually showing biased distortion.

$a_0 \ldots a_9$: coefficients in cubic formula for determination of $x$ $b_0 \ldots b_9$: coefficients in cubic formula for determination of $y$ The above distortion in the optical system, which is represented by barrel type or bobbin type distortion, is expressed by the coordinate conversion formula approximating a cubic equation and correction can be made by carrying out an operation of the conversion formula 1 which provides the correspondence of the target position with the control value applied to the deflector. An illustration on the left in FIG. 13 visually depicts the biased distortion, which can be corrected to an illustration on the right pursuant to equation 1.

(Wafer Outer Periphery)

Figure 14:
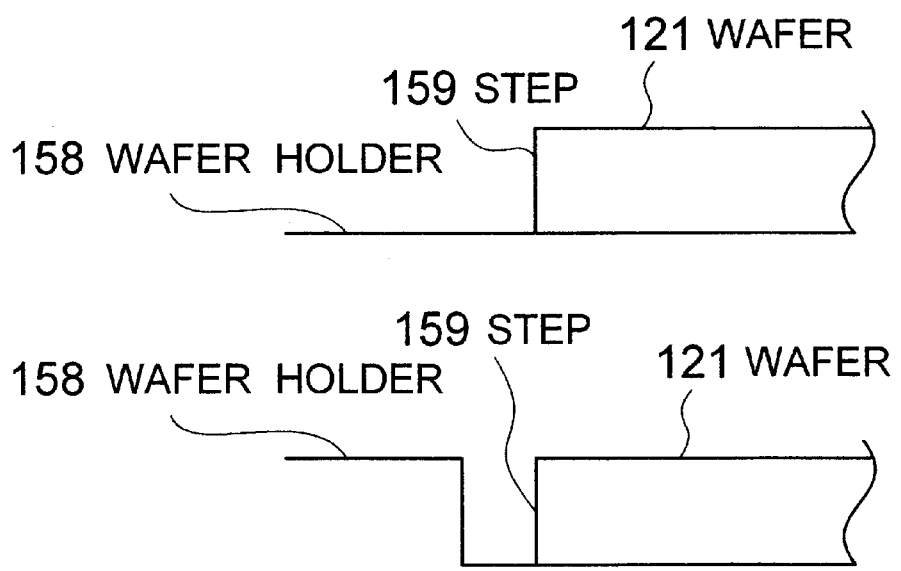
FIG. 14 is a diagram for explaining an example of causes of distortion at the wafer outer periphery.

FIG. 14 diagrammatically explains an example of the cause of distortion at the wafer outer periphery. Retarding voltage is applied to the wafer to reduce impinging energy of the beam with the aim of preventing destruction of the wafer pattern and especially at the wafer outer periphery, the beam is distorted to a great extent by a step 159 between the wafer 121 and a wafer holder 158 and projections. LSI chips (dice) are drawn up to the vicinity of the edge of the wafer and the distortion at the wafer outer periphery makes it difficult to conduct the comparison inspection near the wafer outer periphery or at present, in a range which extends about 15 mm inwardly of the outer periphery. The optical system distortion which differs with the wafer position as above is measured by using a reference wafer on which marks are described at a plurality of sites especially near the outer periphery, and distortion distribution data depending on the wafer position can be obtained. The comparison inspection can be conducted even near the wafer outer periphery by suitably changing coefficients in the above cubic equation for distortion correction operation to those corresponding to the wafer position on the basis of the above data and correcting the beam position.

Since the beam reaches the wafer while being caused to rotate about the coil center by the action of the focusing coil, position offset such as image rotation and image shift of an acquired image is generated when the height of the wafer surface is changed. Accordingly, as for coefficients in the conversion formula 1, coefficients of the deflection correction formula are determined in respect of two height levels of height reference surfaces HI plane and LO plane set up on the wafer holder and a change of the coefficient caused when the height changes is introduced.

In the present embodiment, the system controller conducts calculation of coefficients at the mark position height in respect of a plurality of wafer positions on the basis of the change data representative of the height dependent changes of the coefficients and the mark detection and transfers the calculated co-efficients to the deflection controller. To simplify an operation associated with externally obtained height data, data of the wafer position may be changed to a linear approximation form of equation 2 and then transferred.

$$\begin{bmatrix} s \text{ (astigmatism)} \\ f \text{ (focus)} \end{bmatrix} = \begin{bmatrix} c_0 & c_1 & c_2 & c_3 & c_4 & c_5 & 0 \\ d_0 & d_1 & d_2 & d_{13} & d_4 & d_5 & d_6 \end{bmatrix} \begin{bmatrix} 1 \\ x_0 \\ y_0 \\ x_0 y_0 \\ x_0^2 \\ y_0^2 \\ Z \end{bmatrix} \quad (2)$$

$c_{09} \ldots c_5$: coefficients in cubic formula for determination of $s$ (astigmatism)

$d_{09} \ldots d_6$: coefficients in cubic formula for determination of $f$ (focus)

In the deflection controller, a parameter/system managing unit uses a set of the two coefficients corresponding to the wafer position to be scanned and the height data to calculate coefficients for the beam irradiation position inclusive of height and sets the calculated coefficients in a biased distortion operating unit. In the present invention, the coefficient data transferred to the biased distortion operating unit can be changed in a unit of line to ensure that the coefficients can be changed in compliance with changes in the wafer position and height. In the biased distortion operation, correction can be made at a period of one or more pixels by using a pipe line construction of 100 MHz or more frequency to make it possible to realize correction of the biased distortion expressed by the aforementioned cubic equation. In the above embodiment, the biased distortion correction coefficients are corrected in relation to the height through the linear approximation operation pursuant to equation 2 but the parameter/system managing unit is constructed of processors and so, the operation formula is not limitative.

Stage Tracking and Real-time Correction of Change in Stage/Range Finding System During execution of inspection, the stage is moved stepwise or continuously. In stage operation, a target position on a wafer is moved within a deflection area and the deflection controller constantly tracks the stage position and corrects various kinds of errors to carry out beam scanning. In conducting the chip comparison inspection, predetermined accuracies can not be obtained unless the tracking and correction process is effected.

The error in a unit associated with the stage is classified into a fixed error which is reproducible and a fluctuant error which is not reproducible. The fixed error includes inclination, yawing and pitching of the stage caused by the flatness and mount error of the moving plane mirror and errors in the guide of the stage and an error in measuring position caused by a difference between a position measured by laser and an actual position. The fluctuant error is due to fluctuation caused by speed fluctuation, vibration and a play of the guide. The error in the range finding system includes a laser optical axis mount error and an error due to a delay time between measurement and scanning.

The fixed error can be measured to provide error data by comparing measured data by the laser range finding system and an actual stage position at that time. The actual stage position can be obtained from, for example, the results of image processing based on beam scanning on a reference wafer. In conducting the correction, a certain target position is set and held error data is used to bring this target position to the deflection center and range finding data at that time is considered as new target position data which in turn is transferred to the deflection controller.

For correction of the fluctuant error, the deflection controller uses a range finding value by a means for measuring the stage position and performs a tracking operation of the deflection position to correct the fluctuant error.

Of errors in the range finding system, a fixed error such as optical axis error is corrected in accordance with the fixed error correction process. The deflection controller corrects the time delay in the range finding system by carrying out an extrapolation based on a time-series of stage position. At present, when the speed fluctuation width is +1 mm/s, fluctuation at a period of 1 kHz can be corrected.

Circuit Distortion

Circuit distortion is due to a non-linear error of an analog output signal in relation to a digital signal indicative of the target position and an error caused by temperature change. Causes of the circuit distortion are non-linearity errors of operational amplifiers and differential linearity errors of DA converters. A discontinuous error is corrected by using a correction memory of the DA converter. An error which is static and continuous in relation to the deflection position is included in the biased distortion error dealt with by the deflection correction.

Explanation of Astigmatism/Focus

Equation 2 shows a formula of operating astigmatism and focus in the deflection controller.

A change of focus leads to a change in beam size which causes a change in resolution of a subject to be detected and therefore has the influence upon miss of defects and erroneous detection in the comparison inspection. The focus change is due to a change in the height at the beam irradiation position and the position within the deflection area. The change in the height at the beam irradiation position is measured by a Z sensor and data indicative of the deflection position is held constantly by the deflection controller. In the present embodiment, focus correction is carried out by controlling the small dynamic focusing coil in a change area for correction. Focus circuit distortion, focus lens distortion and hysteresis due to the coil are involved but in the small area, they can be approximated by a linear or quadratic equation.

A phenomenon that the beam shape is changed to an elliptic form owing to the beam incident angle and asymmetry of electric field is called astigmatic aberration. Like the focus change, the astigmatic aberration causes the resolution of a detection subject to change and has the influence upon miss of defects and erroneous detection in the comparison inspection. The astigmatism increases as the deflection position departs from the deflection center and the deflection controller operates an amount of astigmatism correction on the basis of deflection position data held by the deflection controller. Astigmatism correction can be approximated by a linear or quadratic equation. In the present embodiment, for astigmatism correction, the beam shape is adjusted by applying the same potential to diagonally disposed electrodes of the deflector.

Fundamental Construction of the Invention

For one thing, the invention intends to provide a digital operating unit so constructed as to be effectively applied to a digital numerical value operating system in which a digital operation operable at the highest frequency to operate information changing at a high speed at a first period and information changing at a low speed at a second period in combination is carried out to deliver the results at a high speed every first period as described previously.

As an example of an apparatus requiring the above numerical value operating system, the charged particle beam scanning type inspecting apparatus shown in FIG. 1, which is an example of the beam scanning type image information fetching apparatus, will be enumerated.

At present, the time for obtaining an image corresponding to one pixel in the beam scanning direction is defined as the first period f1 which is set to approximately 100 MHz to 200 MHz and the time for one line scanning in the beam scanning direction is defined as the second period f2 which is set to approximately 100 KHz to 200 KHz. The above values are included in one of specifications which are practically required as a result of calculation based on image processing resolution and tact time when, for example, the specimen to be inspected is an LSI chip on a semiconductor wafer and the apparatus is used to obtain a pattern image on the chip so as to inspect whether the pattern image is correct. But if required values or the practicable processing capability are changed within the range in which the present invention can be practiced satisfactorily, the present invention is in no way limited to the aforementioned specifications.

In the apparatus shown in FIG. 1, an important component requiring the numerical value operating system proposed by the present application is the deflection controller 105. The deflection controller 105 is required to conduct a correction control operation for two concrete error objects as shown below.

(1) A fixed error as represented by optical distortion of the lens is enumerated which can be defined in advance by a continuous error function. This error is corrected by calculation of numerical values of coordinate conversion using a conversion function, shape measurement information obtained in advance or combination thereof and the results of correction are reflected on control output.

(2) Position offset of the stage 5, a mechanical change due to unevenness of speed, a change in sympathy with a change in such an environmental factor as temperature and a temporal change are enumerated. These errors are corrected by using sensing information from the stage and the results of correction are reflected on control output.

Here, the control output corresponds to a command given to the beam scanning unit to correctly control the beam.

Figure 2:
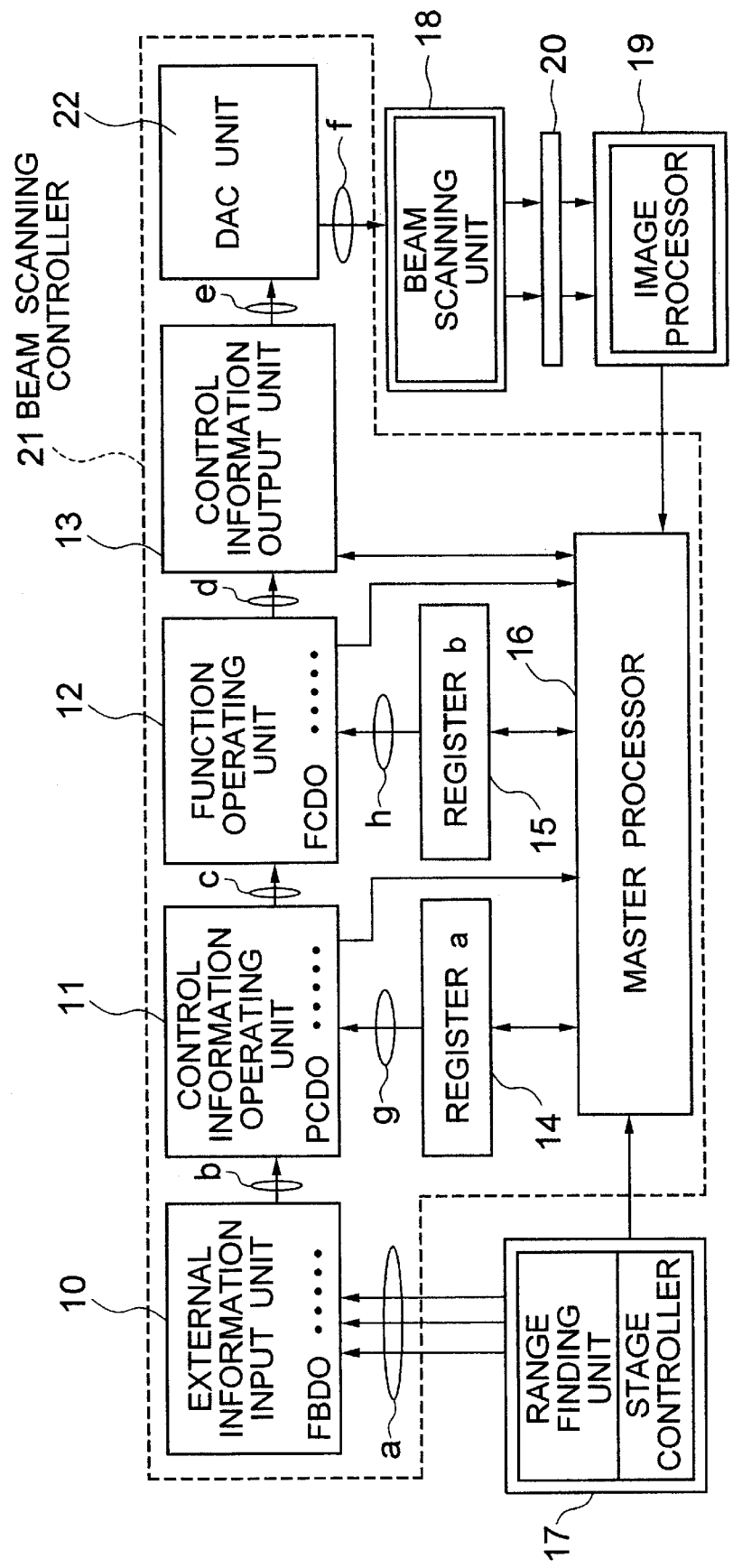
FIG. 2 is a block diagram showing a fundamental system construction of a beam scanning controller.

Referring to FIG. 2, there is illustrated a fundamental construction of the deflection controller of the present invention.

In FIG. 2, a function operating unit 12 is a processor corresponding to item (1) above and a control information operating unit 11 is a processor corresponding to item (2) above. A register a 14 holds, in association with the control information operating unit 11, information g (PCDO . . . ) which changes at the aforementioned second period and a register b 15 holds, in association with the function operating unit 12, information h (FCDO . . . ) which changes at the aforementioned first period. The information of each of the registers is changed by a master processor 16 so as to be used as variables or constants in the process by each operating unit. An external information input unit 10 acquires information a for supervision of the state of the stage, such as position information obtained from the range finding unit of the stage controller 17, to perform a preprocess in which calculating information b is generated. As the input information, either feedback information of control information for drive of the stage or feed-forward information from a sensor provided to the stage may be used. The control information operating unit 11 acquires the information subjected to the preprocess from the external information input unit 10 and generates, at the second period, information c applied to the function operating unit 12.

The function operating unit 12 carries out a projecting process for correcting the optical system distortion represented by a function of the position (X, Y) when a specimen 20 is scanned with the beam, for example, the coordinate conversion formula expressed by the cubic equation of equation 1 so as to make the distortion planar-isotropic and generates basic information d for beam control.

On the assumption that X is in the line direction, the time for the image processor to scan n pixels on one line is a minimum period of the change in Y direction. The period of change of X corresponds to the scanning time of one pixel and accordingly, the period of change of Y can be approximately (change period of X)×n+α. On the assumption that the scanning time per line is about 10 $\mu$s and the number of pixels per line in the X direction is about 1000, the change period of X is nearly 10 $\mu$s/1000=10 ns (f=100 MHz) and the change period of Y is 10 $\mu$s+α. Since the information d responds to the change period of X, this information changes at a high speed at a period of 10 ns. This period is defined as the first period and 10 $\mu$s+α is defined as the second period.

A control information output unit 13 generates digital control information e from which command information f (analog control information) applied to a beam scanning unit 18 originates in a DAC unit 22. This will be detailed later.

The master processor 16 collects the information from the control information operating unit 11, function operating unit 12, image processor 19 and stage controller 17 and conducts the general decision process, management process and process for change of parameters on the register a 14 and register b 15 by using the second period as a fundamental period. In other words, the master processor 16 can be considered to serve as a general control/management unit of the beam scanning-controller 21.

Through high-speed/high-precision digitization in the beam scanning-type wafer inspecting apparatus according to the invention, the performance can be strengthened as outlined below.

(1) The complicated correction process for distortion such as beam distortion due to the optical system and distortion due to electronic circuits is impossible for the analog scheme to achieve but it can be realized in the present invention and improvements in accuracy and enlargement of the deflection scanning area can be assured.

(2) The correction process for control signals of small levels (correction of linearity and bit error) can be ensured to permit improvements in accuracy and enlargement of the scanning area as well as a great reduction of costs incurring in accuracy and tuning adjustments and of fabrication period.

(3) The degree of freedom of manipulating control signals is drastically improved and by setting and changing parameters, the correction process can be changed sequentially during inspection, so that the function can be improved to a great extent, the accuracy can be improved and the inspection area of the subject to be inspected can be extended.

(4) Through high-speed linkage to control of a mechanical portion such as the stage, tracking control by the beam to the target position can be assured, thereby greatly reducing costs incurring in adjustment of accuracy of mechanical portion and tuning and the fabrication term.

A great number of LSI chips are formed on the wafer and these chips are desired to be inspected as quickly as possible by reducing the tact time. On the other hand, design rule is miniaturized to miniaturize the defect detection size (0.05 $\mu$m at present) and the wafer size is increased (12 inches at present), requiring the relative accuracy in relation to the inspection area to be improved and the number and area of chips to be inspected to be increased correspondingly. Under the circumstances, the demands for high speed and high accuracy are accelerated more and more. The beam scanning type inspecting apparatus of the digital processing scheme according to the invention meets the demands as above.

At present, the beam scanning speed is required to be about 10 $\mu$s for the purpose of scanning a line of 1024 pixels in an image and when considering a high-speed operation of 10 ns or more per pixel, that is, 100 MHz or more in terms of frequency and besides the relation between the beam scanning area and the beam position designating accuracy, specifications prescribing accuracy (not resolution) of at least 16 bits or more are demanded.

(Operation Accuracy)

Since the deflection permissible area is 500 $\mu$m, the operation significant digit number after the deflection position calculation is about 20 bits when LSB is about 0.6 nm. When the operation is carried out in terms of fixed point, there needs a fixed circuit which effects digit matching in consideration of rounding errors in numerical value operation and the significant range of necessary numerical values, thus impairing the general-purpose nature. On the other hand, when operation is carried out in terms of single precision real number, the upper limit and the lower limit of numerical values are not restricted practically and operation errors can be eliminated, so that a wide correction operation can be permitted. The single precision real number has a mantissa of 23 bits in addition to the code bit and does not at all matter from the standpoint of operation accuracy.

Construction of Deflection Controller

Figure 15:
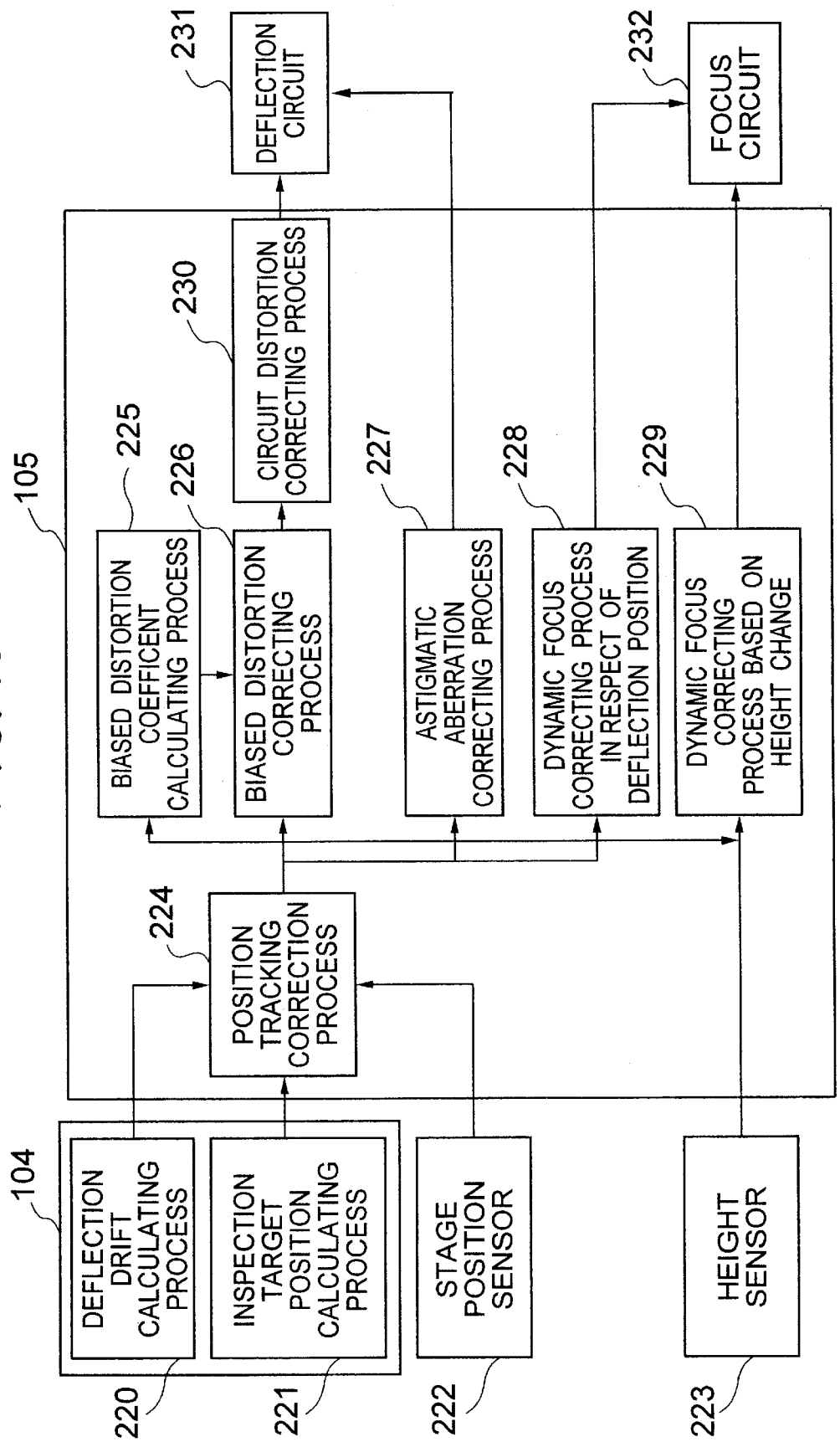
FIG. 15 is a block diagram showing an outline of a correction operation processor in the deflection controller of the present invention.

FIG. 15 diagrammatically explains an outline of the correction operation process in the deflection controller of the invention.

Firstly, the master controller 104 calculates various kinds of parameters necessary for the deflection controller to carry out the correction operation on real time and transfers calculated parameters to the deflection controller 105. The operation carried out in the deflection controller 105 includes extraction of various kinds of correction coefficients used when the deflection control system performs the correction operation for biased distortion, astigmatism and focus on the basis of results of the aforementioned alignment preceding the inspection, a statistical process for extraction of the wafer position and the inspection pattern arrangement, calculation of apparatus errors such as mirror distortion and stage guide distortion, Abbe error and deflector mount error, calculation of inspection target position after the apparatus error and the position error at the inspection site are corrected, and calculation of drift through mark detection carried out during inspection.

Included in various kinds of correction coefficients are the deflection correction coefficient, the astigmatism correction coefficient, the dynamic focus correction coefficient and the focus correction coefficient.

The deflection correction coefficient has several sets of HI plane and LO plane in a coefficient table of cubic approximation and these sets are selected in accordance with the wafer area. By suitably changing the deflection correction coefficient, non-uniform distortion such as for example biased distortion at the wafer outer periphery can be corrected. Each of the astigmatism correction coefficient and the dynamic focus correction coefficient is a coefficient of quadratic approximation calculated in accordance with the deflection position. The focus correction coefficient is linear and quadratic coefficient used to calculate focus correction values in accordance with height information. The master controller 104 calculates the above correction coefficients in advance through measurement such as alignment and the data processing. Accordingly, the contents of operation in each process in FIG. 15 is determined by the master controller. During inspection, the deflection controller uses these correction coefficients to perform operations.

Before inspection, the master controller measures an error of the mounted wafer, an error of the chip arrangement and an apparatus error and holds various kinds of measured error data similarly to the correction coefficients. On the basis of the data, the master controller applies the correction process to the target position to be inspected to provide data of inspection target position 221 which in turn is transferred to the deflection controller.

The inspection target position 221 is typically represented by data of inspection start target position, inspection end target position, line number, line pitch and pixel pitch with the aim of reducing the number of data and the data is transferred to the deflection controller every stripe. When the error correction cannot be approximated by linear approximation, the stripe may be divided into several blocks or data group of each line may be transferred.

As for drift, when the reference marks are detected during the inspection or the master control system determines in accordance with the function measured and calculated before inspection that the change is necessary, drift data is transferred to the deflection control system. The drift includes deflection drift 220 (offset, rotation), focus drift and astigmatic drift. The former one is expected to be changed every several lines but the latter two are expected to be changed infrequently and therefore changed at a frequency which is determined in advance by the user in the inspection sequence.

The deflection controller 105 receives the results of operation of the inspection target position 221 and drift 220 from the master controller 104. Various kinds of correction coefficients used in each operation process conducted by the deflection controller 105 are received as necessary from the master controller as described previously.

In tracking correction process 224, a difference (deflected position) from the center is calculated on the basis of the inspection target position from the master controller 104, that is, the wafer position converted value of the beam target position, the drift value and the present value of the stage received from a stage position sensor 222.

Biased distortion coefficient calculating process 225 receives coefficients of the deflection correction operating formula approximated by a cubic function corresponding to a change of biased distortion in the wafer from the master controller 104, selects coefficients in accordance with the wafer position, calculates coefficients used at present from the coefficient sets of the HI plane and LO plane on the basis of height information from the height sensor and transfers the calculated coefficients to biased distortion correcting process 226.

The biased distortion correcting process 226 receives the coefficients of the deflection correction operating formula approximated by a cubic function from the biased distortion coefficient calculating process 225 and performs a deflection correction operation in respect of the deflection position calculated in the position change tracking correction process 224. Signals after the correction are subjected to circuit distortion correcting process 230 such that analog signals corresponding to digital values can be delivered and then delivered to a deflection circuit 231.

Each processing in the deflection correction process uses the results of operation in the preceding process and therefore, when high accuracy is required, the individual process operations should not be carried out in parallel but must be conducted in the order of the wafer position converting process, tracking correction, biased distortion correction and circuit distortion. To this end, a high-speed digital operation is needed and this is realized with an LSI of pipe line structure to be described later in the high-speed digital operating unit applied to the deflection controller of the present invention.

The deflection position information calculated in the position change tracking correction process 224 is used for astigmatic aberration correcting process 227 and dynamic focus correcting process 228 in respect of the deflection position and control values from these processes are delivered to the deflection circuit and a dynamic focus circuit, respectively. Also, in dynamic focus correcting process 229 based on a height change, information from a height sensor 223 is converted into the dynamic focus correction value and a control value is delivered to the dynamic focus circuit.

Figure 16:
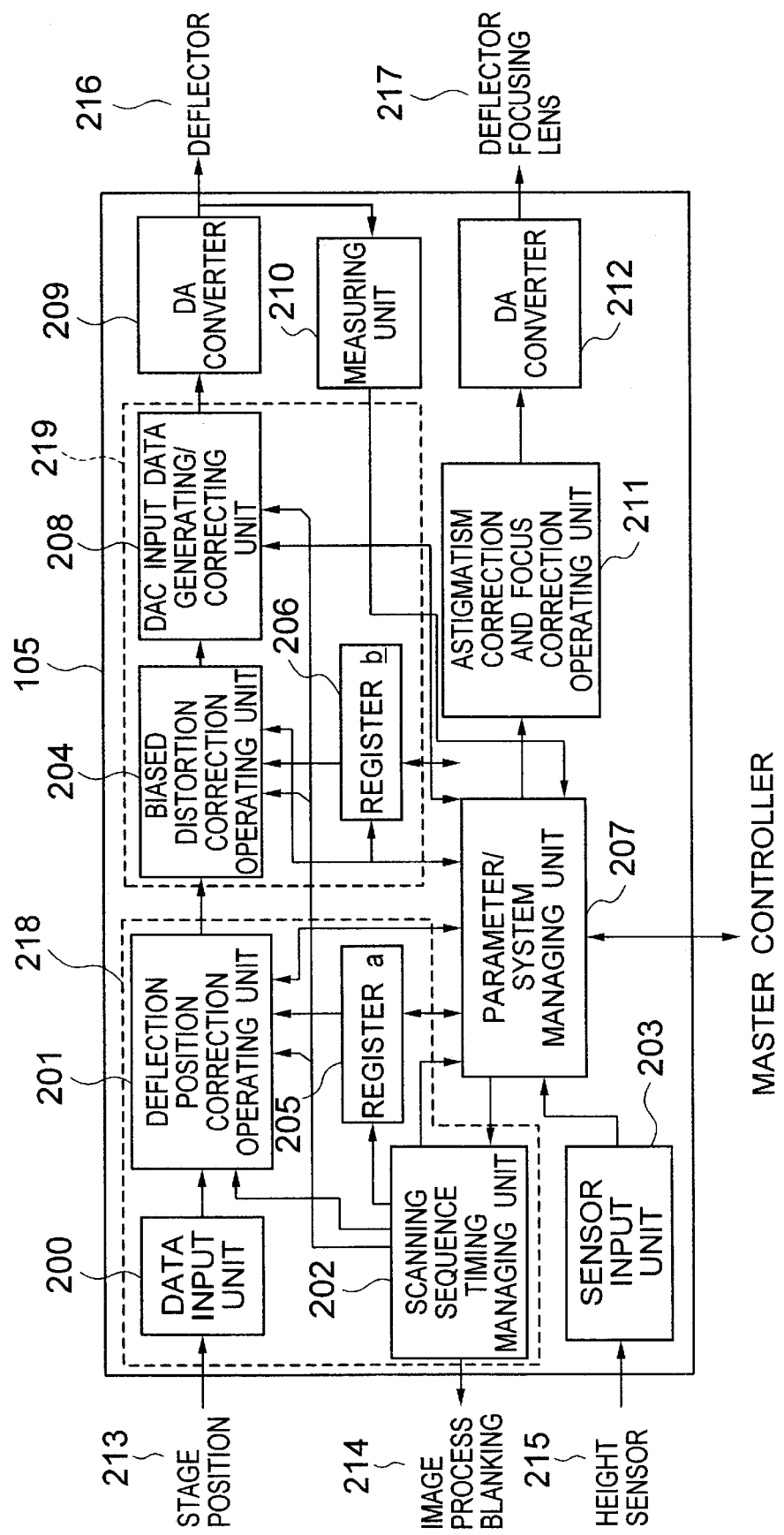
FIG. 16 is a block diagram showing the construction of the deflection controller of the invention for performing a correction operation and beam scanning.

A deflection controller of the invention for performing the correction operation and beam scanning is constructed by further developing the fundamental system represented by the numerical value operating system of FIG. 2 as will be described with reference to FIG. 16.

A data input unit 200 receives stage position information 213, that is, range finding data by the laser. Since the conversion rate of the laser range finding value is 100 ns, an operation using the range finding value is carried out by using a hardware logic. The data of 32 bits is provided for each of the 3 axes and the number of data pieces is required to be 96. In the case of the present invention, the data input unit 200 is provided with an interface for fetching data and besides, has the function of dividing the data to physically reduce the number of data pieces to be fetched. A parameter/system managing unit 207 designates a constant such as apparatus constant, which is commonly used when once set, directly to a deflection position correction operating unit 201 and designates data such as scanning start deflection position, which is one of the inspection target positions and is sequentially designated, to the deflection position correction operating unit 201 through a register a 205 adapted to manage the timing for data change. The common constant is also designated directly to a biased distortion correction operating unit 204, a DAC input data generating and correcting unit 208 and a scanning sequence/timing managing unit 202. The deflection position correction operating unit 201 carries out the position tracking correction process 224 in order to correct a deflection drift obtained from the register a and respond to an inspection target position and a laser range finding value obtained from the data input unit 200 to perform stage position tracking and yawing correction, thereby calculating a scanning start position on the wafer. In the stage position tracking, however, stage speed calculation necessary for correction of delay time in range finding is also effected. The operation delay time (latency) in the present deflection controller during operation at 100 MHz includes 200 ns in the laser input stage, 200 ns in the position tracking correction process 224, 220 ns in the biased distortion correction process and 60 ns in the circuit distortion correction process 230. Especially, operation proceeds at the pixel period in the latter half of the position tracking correction process 224 which is in the range of 50 ns to 330 ns and less affects the delay time. The inspection target position may be either operated from the inspection start target position and the line pitch by means of the system managing unit 207 or designated with a value from the master controller by way of the parameter managing unit 207 and register a 205.

The deflection position correction operating unit 201 calculates a scanning direction from a pixel pitch, a yawing angle based on the laser range finding value and a rotational component of deflection drift. The deflection position correction operating unit 201 also calculates target positions of individual pixels on the wafer from the scanning start position on the wafer and the results of the operation of the scanning direction in accordance with the output sequence from the scanning sequence/timing managing unit 202.

The biased distortion correction operating unit 204 receives the target position of each pixel on the wafer and the biased distortion coefficient to conduct the biased distortion correcting process 226 or the biased distortion correcting operation. The biased distortion coefficient used in this phase is corrected for its change due to the position and height of the wafer as described previously and is set via a register b 206. The deflection coefficient calculating process 225 is carried out by the parameter/system managing unit 207. The DAC input data generating and correcting unit 208 receives target positions subject to the biased distortion in a unit of pixel and calculates a control value necessary for the circuit distortion correcting process 230, that is, necessary for the DA converter adapted to move the beam to the target position. For execution of the circuit distortion correcting process 230, data of analog output characteristics must be obtained in advance. This can be achieved in this example through a path in which data is fetched by a measuring unit 210, the data is processed by the parameter/system managing unit 207 and the processed data is set in the DAC input data generating/correcting unit 208.

Since the target position and biased distortion operation in respect of each pixel is effected in a unit of 10 ns, the scanning sequence/timing managing unit 202, deflection position correction operating unit 204 and DAC input data generating and correcting unit 208 must be constructed with LSI's. In the present invention, from the standpoint of pin number, gate number, heat generation and cost, LSI's of one type are used which can select one of two functions designated by a select signal. More particularly, there are provided one LSI 218 having the function of the data input unit 200, deflection position correction operating unit 201, scanning sequence/timing managing unit and register a and one LSI 219 associated with each of the deflection coordinate X and Y directions and having the function of the biased distortion correction operating unit 204, DAC input data generating and correcting unit 208 and register b 206, indicating that three LSI's in total are used in one apparatus.

An astigmatism correction and focus correction operating unit 211 carries out the astigmatism correcting process 227, the dynamic focus correcting process 228 depending on the deflection position and the dynamic focus correcting process 229 depending on the height change. Correction data is converted into an analog signal by a DA converter 212 and the analog signal is controlled at the deflector and the focusing lens 217. The astigmatism correction 227 and the dynamic focus correction 228 depending on the deflection position automatically correct an astigmatic phenomenon and focus blur which change depending on the deflection position and when the deflection position moves by about 50 µm, the correction value is changed at intervals of very slow time at present, for example, at a period of 5 ms in the case of the stage step and repeat mode and several seconds or more in the case of the continuous moving mode. Accordingly, data of the deflection position information inputted to the astigmatism correction and focus correction operating unit 211 is read out of the deflection position operating unit 201 by means of the parameter/system managing unit 207 and transferred to the astigmatism correction and focus correction operating unit 211 in the present invention but alternatively, it may be transferred directly from the deflection position operating unit 201.

Similarly, for the dynamic focus correcting operation 229 depending on the height change, data of the input at the 1 ms period from a height sensor 215 is read out of a sensor input unit 203 by means of the parameter/system managing unit 207 in the present invention and then transferred to the astigmatism correction and focus correction operating unit 211 but it may be transferred directly from the input sensor unit 203.

A portion where the data change time is 100 ns or less, the processor cannot follow the operation time and hence this portion must be constructed with hardware. Especially, it is difficult to form a portion where the data change time is 10 ns or less on a substrate and practically, this portion is fabricated with an LSI. The processor needs a single or a plurality of LSI control processors and a single or a plurality of processors for performing other operations. The latter is required to have the function of interfacing to the master controller, interfacing to the LSI control processor, operating astigmatism and focus correction, calculating deflection correction coefficient depending on the height position and managing the inspection operation state.

At present, the time required for the processor to transfer data on a memory to a register of LSI is 280 ns and 35 data pieces can be transferred within one line, that is, about 10 µs. The deflection coefficient is represented by a total of 20 data pieces in the X and Y axes and therefore, all of the data pieces can be rewritten within one line. In case much time is required for operation process and data rewrite within about 10 µs is not permitted, such an event can be dealt with by designating a line start timing to the scanning sequence/timing managing unit 202 after the rewrite is completed. In that case, one line is scanned at intervals of 10 µs or more. Alternatively, the speed at the bus clock may be increased or a method of accessing the bus at a high speed described in a patent application by the present applicant (dynamic bus protocol) may be employed to reduce the time for transfer to the register.

The scanning sequence/timing managing unit 202 is mainly constructed of a counter circuit to manage timings for the individual components. Setting of timings is effected by the master controller 104 and the parameter/system managing unit 207. Signals to the outside are mainly delivered to image process and blanking 214. For the image process, with the aim of effecting synchronization with the secondary electron detection system and transfer of the inspection position to the image processing system to permit accurate position detection, timing within an inspection effective interval in the stripe direction is controlled, timing within an image fetching effective interval in the line (scan) direction is controlled and timing for deflecting the beam by the deflection controller and for causing a signal to propagate to the detector, that is, timing for image fetching is controlled. Internal signals control timing for changing data to the registers 205 and 206, timing for the pipe line structure data to flow to the deflection position correction operating unit 201, biased distortion correction operating unit 204 and DAC input data generating and correcting unit 208 and timing for pixel data change as well as the number of pixels.

Biased Distortion Correction Operating Unit

Now, in the embodiment of the invention, a first constituent component of beam scanning controller 21 which is important for conducting the digital process and is difficult to realize is the function operating unit 12 required to operate the function process shown in equation 1 at a throughput of f=100 MHz or more. For simple execution of equation 1, 36 addition operation and 36 multiplication operations are needed and with normalization included, 40 or more operations are required. If these operations are executed on the basis of a general-purpose description similar to equation 1, the ability to conduct a real number operating process of floating point type 4 G times/s (4 GFLOPS) is needed. In addition to the above, a preprocess operation and a correction operation are sometimes required to be executed in combination and a case where the ability to conduct the process approximately 10 G times/s (10 GFLOPS) is needed is expected.

In constructing the function operating unit 12, items summarized below matter.

(a) In order to conduct the high-speed operation as above, the real operation process must be executed in a parallel pipe line fashion and a great number of transistors are needed. Further, for linkage with the controller operating on real time, the latency must be kept to be small and from the standpoint of reduction of wiring, necessity for a compact construction takes place. In other words, a very highly integrated LSI or electronic circuit board must be realized and there is a need of high-quality logic design technology and transistor number reduction technology.

(b) When trying to realize the above (a), many transistors in a small area are brought into frequent switching operation and concomitantly, a large amount of heat will be generated. Circuit design for suppressing the heat generation must be contrived.

(c) Information from the register and information changing at different periods must be fetched smoothly to the high-speed process and the processed information must be read by the master processor on real time. In other words, a high-quality synchronizing process technique is required for circuit operation.

For the above reasons, the beam scanning controller 21, excepting the DAC unit 22, may preferably be constructed of a LSI. In a practiced example, because of the restricted amount of gate and the restricted number of pins, the external information input unit 10, control information operating unit 11 and register a 14 are realized with one chip, the function operating unit 12, control information output unit 13 and register b 15 are realized with another chip and these chips are switched from each other by a select signal on one kind of LSI.

Figure 3:
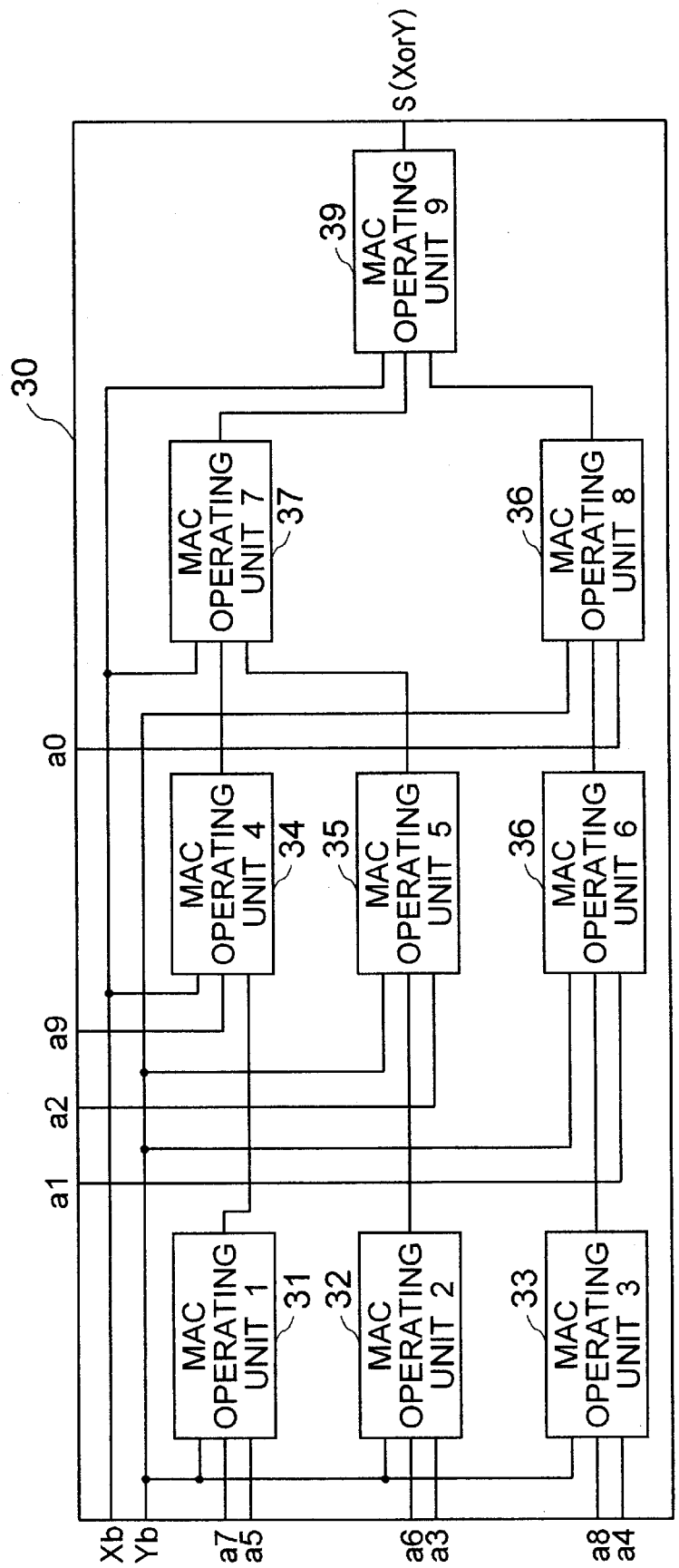
FIG. 3 is a block diagram showing an example of practicing equation 1 with a MAC operating unit section.

In an example of a method of realizing the (a) above, a MAC operating unit in which a multiplier is integrated with an adder in a product/sum type form is constructed as a fundamental operating unit and the fundamental operating units are combined and operated in parallel at the highest efficiency to execute the operation of the aforementioned equation 1 as shown in FIG. 3. The MAC operating unit is constructed of a general-purpose real number operating unit pursuant to, for example, the real number format of IEEE standards in order that responsive to a real number input, results in the range of desired numerical values can be obtained.

An operating unit section 30 for execution of equation 1 shown in FIG. 3 is constructed to carry out operation in only one of the two control directions (x, y). To execute equation 1, two operating unit sections each constructed as shown in FIG. 3 are operated in parallel.

The configuration of the MAC operating units 31 to 39 has the following advantages.

1) The intermediate format can be set freely and therefore the number of gates can be more reduced as compared to the case where the multiplier and the adder are connected in a simplified manner (at least 1000 or more gates can be omitted).

2) The number of rounding processes can be reduced, thus keeping the accuracy high.

3) When the pipe line to be described later is employed, the operation latency can be shortened, in addition to the advantages 1) and 2) brought about by a pipe line configuration to be described later and therefore, the number of pipe line stages can advantageously be reduced. This also contributes greatly to reduction of the number of gates and reduction of power consumption.

Incidentally, when the configuration of FIG. 3 is realized with scalar operating units of transmission type, MAC operation per stage has a latency of about 50 ns on the assumption that the operating units are designed as an LSI of CMOS process. The latency required for processing all operations amounts up to about 200 ns even if the optimum parallel processing configuration is employed, making it impossible to obtain a period of not greater than 10 ns (f=10 MHz) in calculation. Thus, as described previously, there is a need of employing the pipe line parallel type operating unit configuration. But, if a simple pipe line configuration is adopted, the number of pipe line registers for holding intermediate data increases to increase heat generation concomitant with switching in the pipe line registers and the number of transistors (the number of gates) as indicated in the aforementioned (b).

Figure 5:
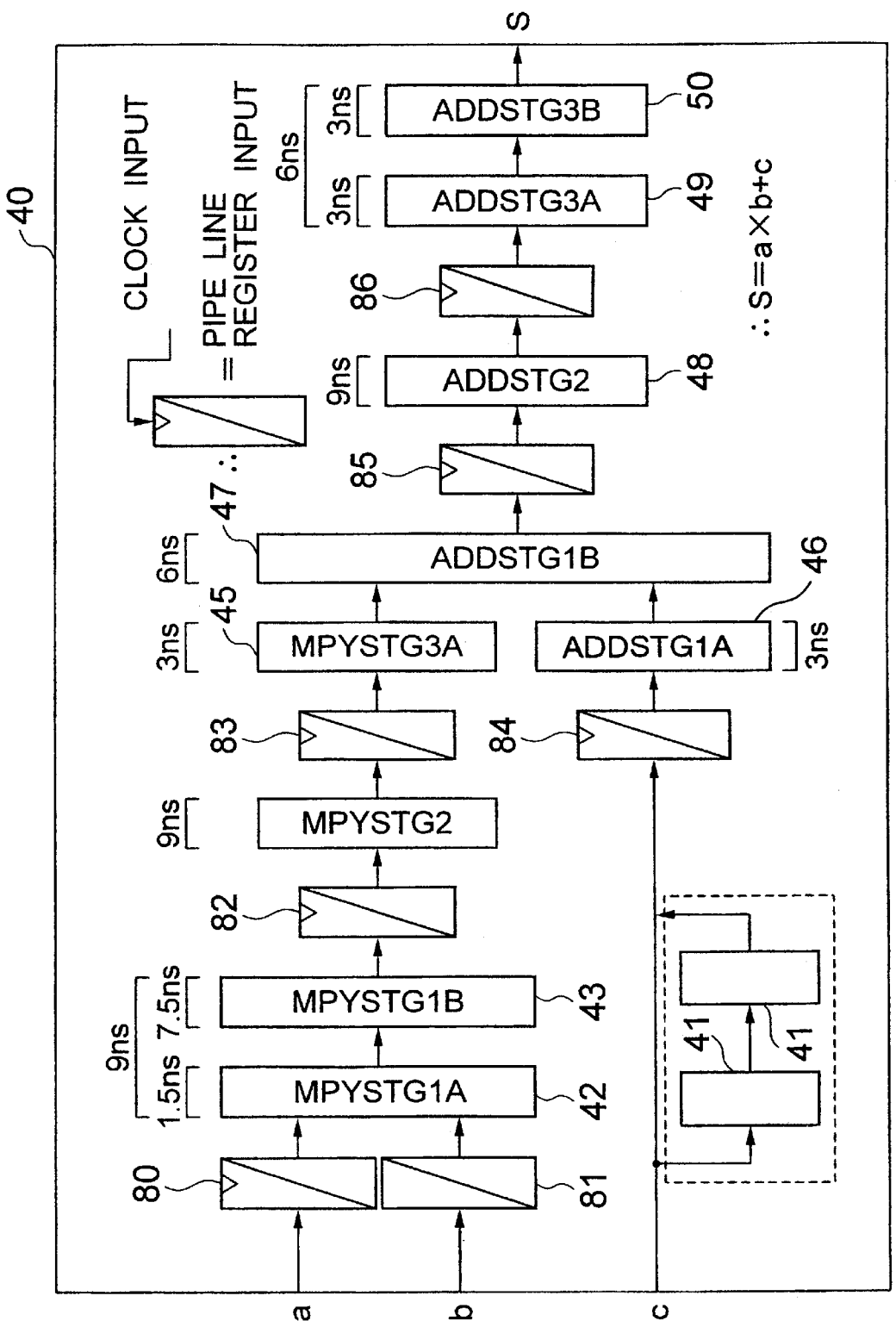
FIG. 5 is a diagram showing operation division distribution in the MAC operating unit section of pipe line structure.

Accordingly, a MAC operating unit section 40 having a 5-stage pipe line structure as shown in FIG. 5 is proposed. In a dotted line block in FIG. 5, a pipe line register 41 is provided which is required to match the operation stages when a simple pipe line structure is adopted and by virtue of the register 41, the number of gates can be reduced in terms of transistors by about 1600 transistors per MAC operating unit and switching power can be dispensed with.

Figure 4:
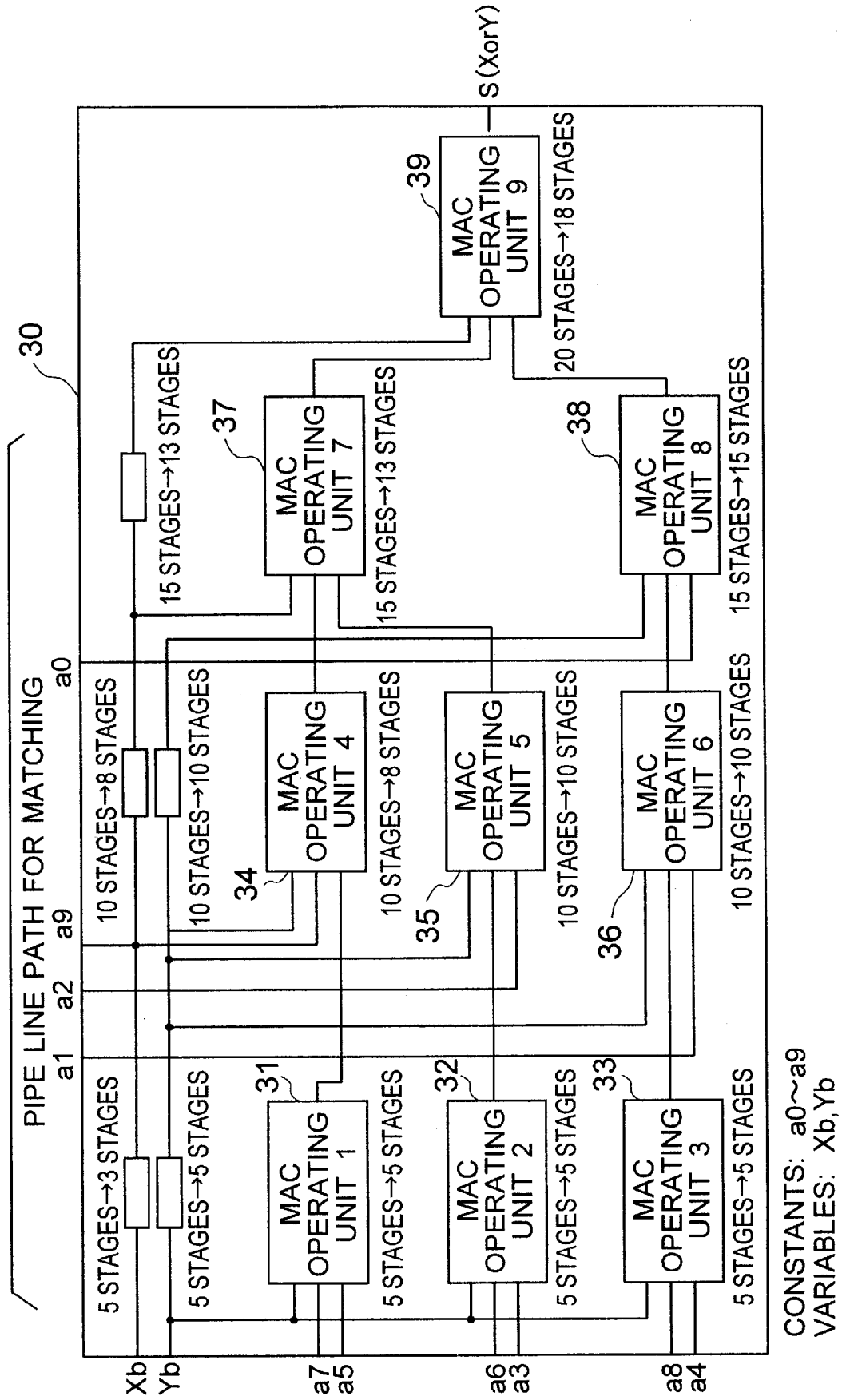
FIG. 4 is a block diagram for explaining reduction of the number of pipe line stages when a MAC operating unit section of pipe line structure of FIG. 5 is applied to the construction of FIG. 3.

But a numerical value parameter c is inputted to the MAC operating unit section at a different timing from input timings of parameters a and b and so, there is a possibility that matching of the operating unit stage number cannot be obtained. However, as shown in FIG. 4, the overall process can be executed without discrepancy by adjusting only a pipe line path for matching of input conversion (Xb, Yb) changing at f=100 MHz or more. In FIG. 4, the configuration of FIG. 3 as a whole is formed into a pipe line structure by applying the MAC operating unit section of FIG. 5 s in the pipe line structure form. In the figure, XX→YY indicated above or below individual modules shows the number of total pipe line stages inclusive to the output stage, XX corresponds to the case where the dotted line block in FIG. 5 is included and YY corresponds to the case where the MAC operating unit section of the present type useful to reduce the number of gates is used. It will be seen that not only the total latency but also the number of pipe line stages for matching can be reduced. Eventually, the total latency in terms of stage can be reduced by 20 to 18 stages and 22 pipe line registers in total can be omitted. In case the multiplier and the adder are combined in a simplified manner, 6 pipe line stages are required for each MAC process and consequently, additional or surplus pipe line registers amounting up to 57 stages are needed as compared to the present scheme.

Operation in the MAC operating unit section 40 of pipe line structure is divided and distributed as shown in FIG. 5.

The MAC operating unit section 40 can operate at a period of about 10 ns (f=100 MHz). Namely, input parameters a, b and c can be thrown in at the 10 ns period in synchronism with the clock and a result S of the pipe line process (S=a×b+c) is delivered at the 10 ns period. In MPYSTG1A 42 and ADDSTG1A 46 of input stage, data (a, b, c) inputted in the form complying with the IEEE standards must be changed to an internal format (binary format) which is easy for operation process. This change process consumes about 1.5 to 3 ns. With the MAC operating unit section of the present invention in which the multiplier and the adder are used in combination, however, a final stage of MPYSTG3A 45 of multiplication and a stage ADDSTG1A 46 for change to the internal format in the c input of addition can be processed in parallel. The final stage MPYSTG3A 45 of multiplication stage need not be followed by a stage for conversion to the IEEE format (corresponding to the MPYSTG3B) and data of the internal format as it is can be transferred to an adder stage ADDSTG1B 47. Accordingly, in the initial stage of addition, a conversion stage (corresponding to ADDSTG1A) need not be executed for results of the multiplier. It suffices that an output stage (corresponding to ADDSTG3B) for conversion (inclusive of rounding process) into the IEEE format and delivery to the succeeding operating unit is provided for only the final stage of adder.

From the above, the latency is distributed such that 9 ns in total is allotted to multiplication stages MPYSTG1A 42 and MPYSTG1B 43, 9 ns is allotted to multiplication stage MPYSTG2 44, 3 ns is allotted to multiplication stage MPYSTG3A 45, 3 ns is allotted in parallel to addition stage ADDSTGL1A 46 and multiplication stage MPYSTG3A 45, 9 ns is allotted to addition stage ADDSTG1B 43, 9 ns is allotted to addition stage ADDSTG2 48, 3 ns is allotted to addition stage ADDSTG3A 49 and 3 ns is allotted to addition stage ADDSTG3B 50. The final stages ADDSTG3A 49 and ADDSTG3B 50 are allotted with 6 ns in total in order for these stages to have a margin of about 3 ns (delay margin in transmission path) making room for transmission to an operating unit of the succeeding stage. The data compressed into the IEEE format is required to be inputted/outputted for the purpose of matching the external general-purpose data input format but additionally, for the following reasons:

a) The effective internal format is different for the adder and the multiplier; and b) The bit width of the internal format is wider than that of the IEEE format and the gate number, switching power and the connection amount between operating units in the internal format are disadvantageous to those in the IEEE format.

For the above reasons, the MAC operating unit section of the present invention can be constructed of the 5-stage pipe line and as compared to the case where general-purpose multipliers are used in combination in a simplified manner, can reduce the number of pipe line stages by 1 to 2 stages and the total gate number by about 15 to 20%.

Register

Next, measures to solve the problem of synchronization concerning the input/output from/to the outside shown in the (c) above will be described. Interchange with the outside principally indicates interchange with the master processor.

Firstly, a method of setting data to the register b 15 holding parameters (real number parameters a0 to a9 in FIGS. 3 and 4) given to the function processor is based on the register configuration and technique as below.

Figure 6:
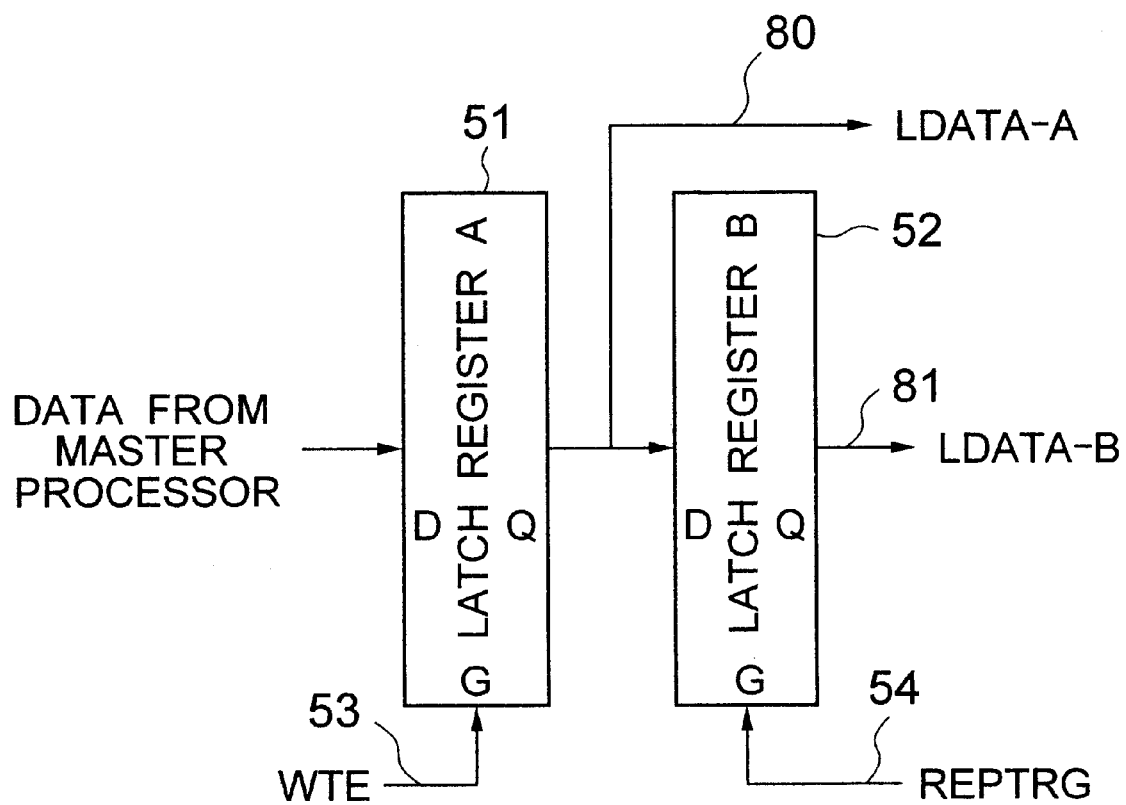
FIG. 6 is a diagram for explaining the construction of a write data register serving as synchronizing means during write.
Figure 7:
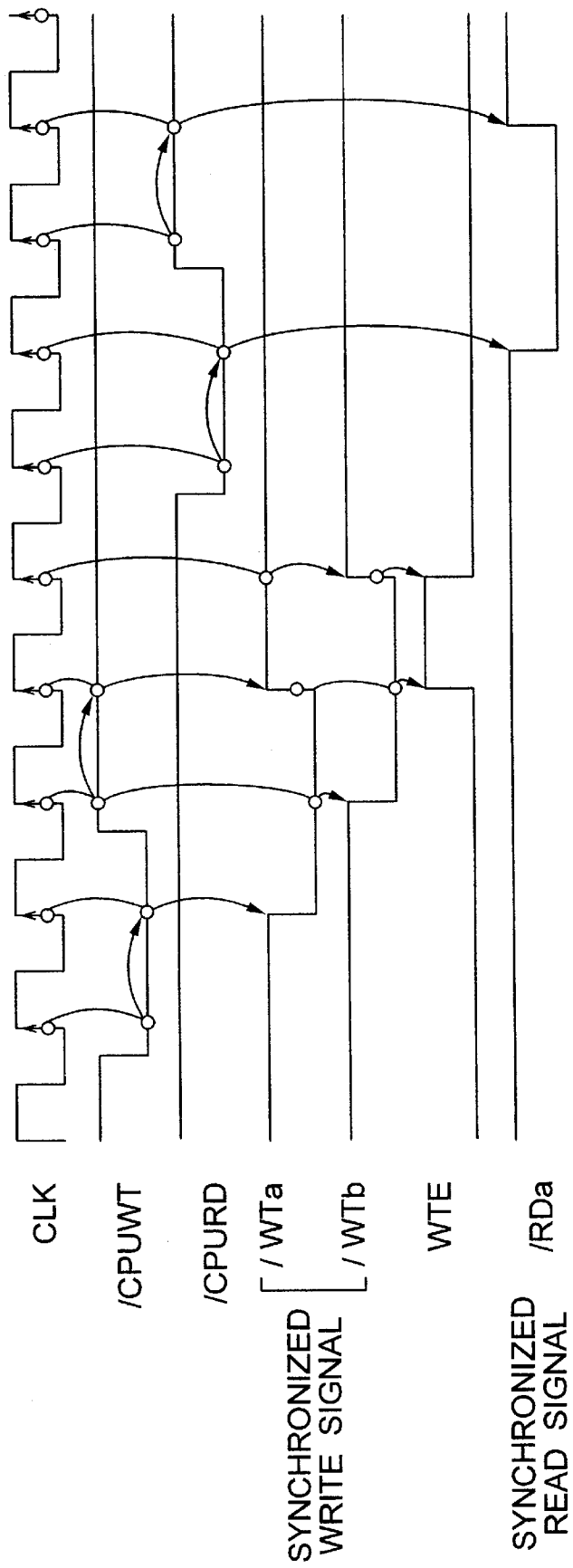
FIG. 7 is a diagram for explaining synchronization of an access signal from a master processor with a reference clock.

(A) The clock for operating the master processor must be considered to be asynchronous with the reference clock (f=10 MHz or more) of the beam scanning controller and to enable the master processor to freely access the register in the beam scanning controller, synchronization must be set up between an access decision signal from the master processor and the reference clock. To this end, a synchronization process of asynchronous signals is applied as shown in FIG. 7 in which a write command (/CPUWT) from the master.processor is shifted by means of two or more stages of flip-flop by using the CLK (f=100 MHz or more) to generate /WTa. When the /WTa is further shifted by one or more stages to generate /WTb, a period in which /WTa is high and /WTb is low can be taken out to generate WTE synchronous with the CLK. For example, when data from the master processor is latched into a latch register A 51 shown in FIG. 6 in response to the WTE 53, latched data LDATA-A (80) can be delivered synchronously with the CLK.

(B) There is an instance in which only parameters which have been changed in advance are desired to be changed collectively at a timing (for example, at the beginning of sampling period) and applied to the function operating unit 12. To this end, a method is adopted in which as shown in FIG. 6, the latched register A is followed by another latch register B and the contents of the latch register A is copied to the latch register B in response to a signal 54 (REPTRG) indicative of a timing for collective change. When registers responsive to the signal REPTRG are connected in common to the latch register B, the contents of these registers can be changed simultaneously at a suitable timing. In that case, LDATA-B (81) is used as an output. In general, the REPTRG signal is generated synchronously with the CLK in response to an access control signal (/CPUWT, /CPURD) from the master processor by using a synchronization method of asynchronous signals similar to that used for generation of the WTE but alternatively, may be generated by using an external replace command in synchronism with the CLK.

(C) In the configuration of the registers shown in FIG. 6, the latch registers A (51) and B (52) are constructed of gate latches. In this case, the gate latch has the function of transmitting data at D input to deliver it to Q output (LDATA-A (80), LDATA-B (81)) when a signal (here, WTE 53, REPTRG 54) applied to G input is high level and latching and holding the data at the D input at a timing for the signal applied to the G input to shift to low level. By using the gate latch, the configuration can be completed by using gates the number of which is approximately half the number of gates used in flip-flops and is advantageous from the standpoint of power consumption.

Next, a synchronizing means used when the master processor reads data group synchronous with the CLK (F=100 MHz or more) in the beam scanning controller inclusive of the function operating unit will be described.

(a) As shown in FIG. 7, a read command (/CPURD) generated from the master processor is synchronized with the CLK by synchronizing means similar to that used for generation of /WTa to generate a /RDa signal.

Figure 8:
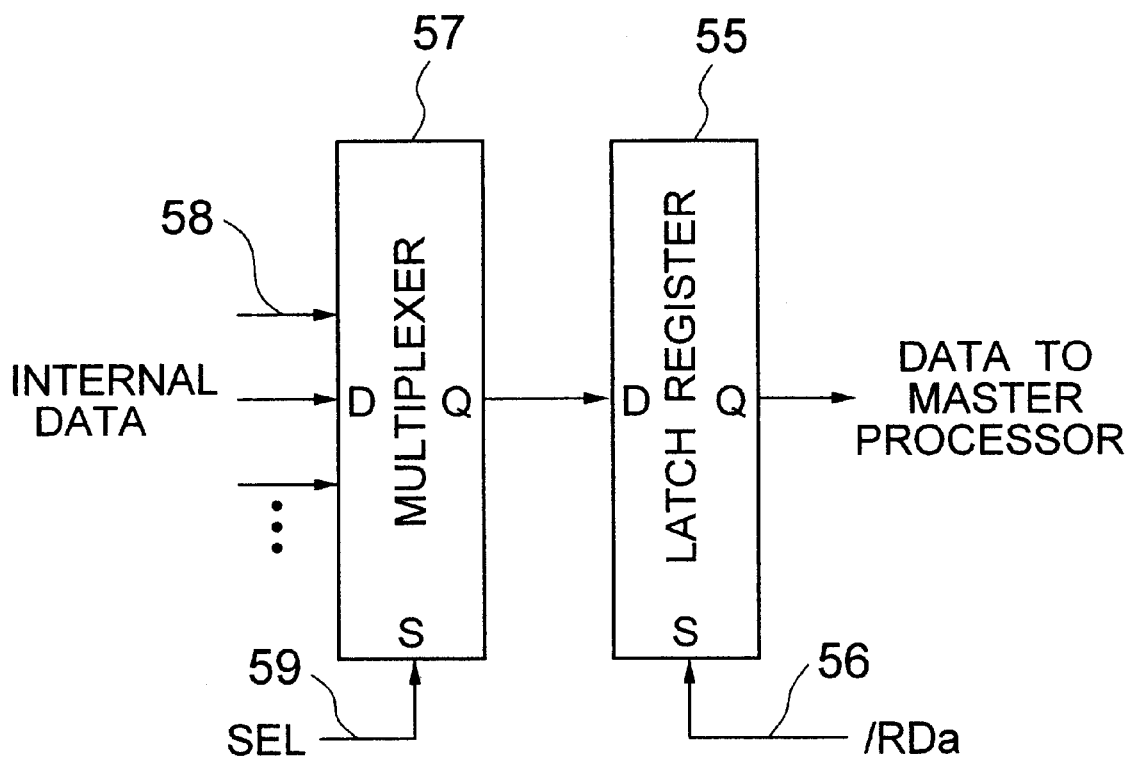
FIG. 8 is a diagram for explaining the construction of a read data register serving as synchronizing means during read.

(b) A latch register 55 as shown in FIG. 8 is provided for latching an internal register and internal data 58 synchronous with the CLK and selected by a selection signal SEL 59 is latched to the aforementioned latch register through a multiplexer MUX 57 in response to a rise timing of the generated /RDa signal 56. Through this, the desired internal data can be indicated correctly to the master processor during a period which ranges from a timing about one CLK preceding the fall of the /RDa to a timing at least about one CLK or more preceding the fall (end) of the /CPURD. The master processor simply reads the indicated data. The multiplexer MUX 57 can be switched and generally, as the selection signal SEL 59 for applying the desired internal data to the latch register 55, an address signal supplied from the master processor or a signal modified responsive to the address signal may be used.

Next, the control information output unit 13 for converting the results from the function operating unit 12 into highly accurate analog information and delivering the information at a rate of 100 MHz or more will be described.

DAC Input Data Generating and Correcting Unit

Figure 9:
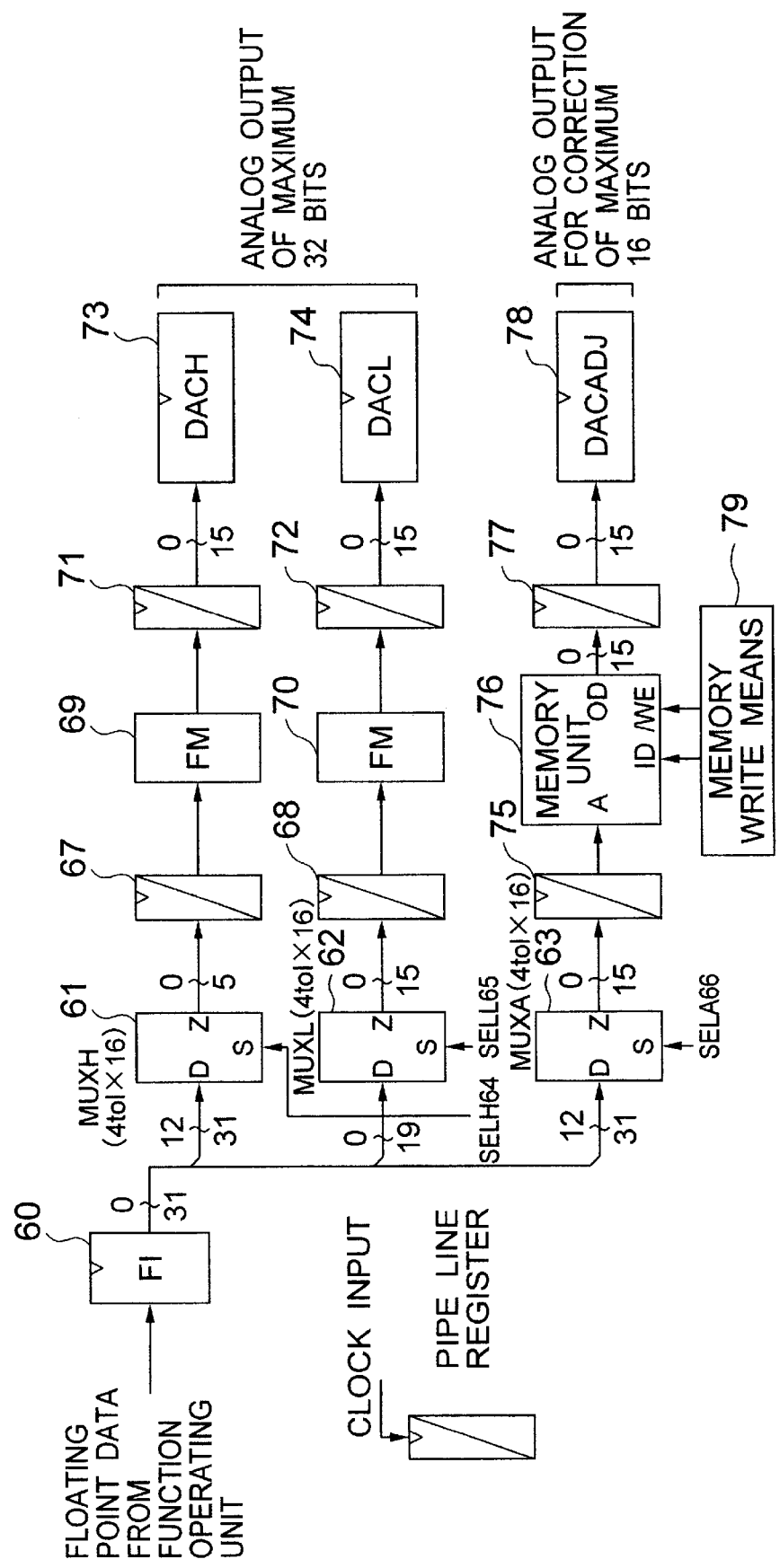
FIG. 9 is a diagram for explaining means for changing digital data into high-precision analog information at a period of 100 MHz or more.

Referring to FIG. 9, there is illustrated a means for changing the results to highly accurate analog information at a period of f=100 MHz or more. An operating unit FI 60 is adapted to convert floating point data (real number) into an integer value (32 bits) and multiplexers MUXH 61, MUXL 62 and MUXA 63 respond to selection signals SELH 64, SELL 65 and SELA 66, respectively, to select upper 20 to 16 bits of the 32-bit data delivered out of the FI 60. Outputs of the multiplexers MUXH 61 and MUXL 62 are respectively inputted to DACH 73 and DACL 74 each having the performance of a sampling frequency of 100 MHz or more through pipe line registers 67 and 68 constructed of FF's, logics FM 69 and 70 for conversion into an input format of the DAC (digital/analog converter) and pipe line registers 71 and 72. On the other hand, an output of the MUXA 63 is applied to an address input of a memory unit 76 through a pipe line register 75, so that corresponding data is delivered out of the memory unit 76 and inputted to a DACADJ 78 (DAC for correction) having the performance of a sampling frequency of 100 MHz or more through a pipe line register 77.

In the present example, by adding analog outputs from the DACH 73 and DACL 74 in an analog fashion, an analog output of a maximum 32-bit resolution level can be obtained. But, without correcting the non-linearity and the reference offset error in the DAC, satisfactory accuracies cannot be obtained and therefore, by principally considering correction of the DACH which causes a bottleneck to accuracy, the DACADJ 78 is provided which delivers a correction addition value. To provide the correction addition value, the sum of the DACH 73 and DACL 74 is measured in advance by means of a high-precision voltage meter and error correction serving as an addition value is held in advance in the memory unit 76 by means of a memory write unit 79. Accordingly, analog outputs of the DACH, DACL and DACADJ can be used so as to be added in an analog fashion, thereby providing an output of highly accurate analog information.

As described above, in contrast to the analog scheme in which the deflection scanning waveform is generated by the analog circuit, the digital type deflection controller can be constructed in which even correction of the deflection scanning signal is made through complete digital operations and digital values are sequentially converted into analog values by a time series of digital control signal to form the deflection scanning waveform, bringing about the following advantages.

When the deflection controller is realized with the digital scheme in the beam scanning type inspecting apparatus, the process for correction of distortion such as distortion of the beam due to the optical system and distortion due to electronic circuits can be realized by performing operations in digital values through the use of correction formula and correction tables to ensure improvements in accuracy and enlargement of the deflection scanning area, thus solving the problem concerning linearity and distortion.

The problem concerning the timing can be solved by causing the digital operation per se to be effected in synchronism with the clock so as to manage the time accuracy of timings synchronous with image fetching such as start and end and facilitate setting of timings in digital values.

Also, when the deflection controller is realized with the digital scheme in the beam scanning type inspecting apparatus, the degree of freedom of manipulating the control signal can be improved drastically, the correction process and the scanning signal setting value can be changed sequentially during the inspection by setting and changing parameters to thereby improve the function to a great extent, improvements in accuracy and enlargement of the inspection area of the inspection subject can be achieved, and the distortion can be corrected, thus solving the problem of position accuracy raised when comparison of patterns of separate sites is carried out and the problem that a site subject to non-uniform biased distortion cannot be inspected.

Further, through the use of digital data, control of the mechanical part such as the stage can be linked at a high speed to the controller for managing the whole system, so that tracking control to the target position using the beam and the measurement and correction of the apparatus error can be assured, thus solving the problem of high costs and prolongation of the fabrication term.

In realizing the digital scheme, however, the beam must be moved to the target deflection position at at least the image information fetching period, namely, at the rate of one pixel and therefore, it is preferable that the correction signal be delivered at a time point within the image information fetching period. The accuracy is degraded as compared to the case where correction is made every pixel but if correction within one line can be permitted, the accuracy can be improved as compared to the analog scheme in which correction can be made only at least every line.

In connection with the required high-speed capability, the control output is of 100 MHz or more when taking the relation between the inspection time and the beam-irradiation time for controlling charging on the inspection subject into consideration and to assure high accuracies, the control signal is required to be of 16 bits or more from the standpoint of the relation between the required deflection area of 500 $\mu m^2$ or more and the required accuracy of 20 nm or less.

Meritorious effects attained by the embodiment of the inspecting apparatus of the present invention are as follows.

(1) Correction of the biased distortion and sequential change of the biased distortion coefficient can be assured and a site where the electric field is non-uniform as represented by the wafer outer periphery can be inspected.

(2) With the position accuracy improved, the pattern comparison inspection for separate sites as represented by the chip comparison inspection can be permitted.

The embodiment of the deflection controller according to the present invention attains meritorious effects as below.

(1) The complicated correction process for various kinds of distortion such as beam distortion due to the optical system and distortion due to the electronic circuits, which process cannot be fulfilled with the analog scheme, can be realized to permit improvements in accuracy and enlargement of the deflection scanning area.

(2) Since the digital operation per se is effected in synchronism with the clock, the time accuracy of image fetching synchronization timing can be improved and its setting can be facilitated to improve the position accuracy.

(3) The degree of freedom of manipulating the control signal can be improved drastically and the correction process can be changed sequentially during the inspection, so that the function can be improved to a great extent and improvements in accuracy and enlargement of the inspection area of the inspection subject can be assured.

(4) High-speed linkage to control of the mechanical part such as the stage can be effected, thus ensuring that beam tracking control to the target position by the beam can be permitted, the costs incurring in adjustment of accuracy of the mechanical part an of tuning can be decreased considerably and the fabrication period can be reduced drastically.

According to the present invention, by delivering the signal for controlling the deflection at a time point within the image fetching period in the form of a digital signal, various kinds of correction in beam deflection control can be facilitated, thus providing the high-speed, high-precision beam scanning type inspecting apparatus.

What is claimed is:

1. A charged particle beam scanning inspecting apparatus for irradiating a charged particle beam, fetching information of a subject to be inspected at a predetermined beam scanning position and performing an inspection by processing the information, comprising:

means for measuring a scanning position of the beam and an inspection position on said inspection subject to calculate beam target coordinates corrected for an apparatus error, an error correction constant and a deflected distortion correction constant; and a deflection controller for scanning the beam, said deflection controller including:

a deflection position operating circuit for performing an operation of the inspection position in a deflection coordinate system necessary for accurate scan of the inspection position on the inspection subject by using said beam target coordinates externally set in advance or as necessary, said error correction constant, a scan constant and present coordinates of an inspection stage; and a deflected distortion operating circuit for correcting deflected distortion by using said deflected distortion constant externally set in advance or as necessary and the deflection position and performing an operation of the deflection control amount necessary for accurate irradiation of the beam onto said deflection position, said deflection position operating circuit and deflected distortion operating circuit being constructed in a pipe line fashion.

2. A charged particle beam scanning inspecting apparatus according to claim 1 further comprising a deflected distortion change unit for sequentially changing, during inspection, the deflected distortion correction constant supplied to said deflection controller, wherein when a portion near the outer periphery of a wafer where the deflected distortion is nonuniform is inspected, said deflection controller uses, as said deflected distortion correction constant, a deflected distortion correction constant corresponding to a wafer position measured in advance.

3. An inspecting method in a charged particle beam scanning inspecting apparatus for irradiating a charged particle beam, fetching information from a subject to be inspected at a predetermined beam scanning position and comparing first and second chips formed on a substrate to thereby inspect a semiconductor pattern defect, comprising the steps of:

measuring the position, rotation and size of each of first and second patterns and optical system distortion in advance to calculate a scan constant and a correction constant;

sequentially changing scan parameters and the correction constant during inspection of said chips; and correcting the beam scanning by using said changed correction constant even when the arrangement error and distortion differ for the patterns of said chips to be compared.

4. A charged particle beam scanning inspecting apparatus according to claim 1, wherein said period is not greater than 10 ns.

* * * * *